United States Patent
Zhou et al.

(10) Patent No.: US 10,177,324 B2
(45) Date of Patent: *Jan. 8, 2019

(54) WHITE ORGANIC ELECTROLUMINESCENT DEVICE AND PREPARATION METHOD THEREOF

(71) Applicant: Changchun Institute of Applied Chemistry, Chinese Academy of Sciences, Changchun, Jilin (CN)

(72) Inventors: Liang Zhou, Jilin (CN); Hongjie Zhang, Jilin (CN)

(73) Assignee: Changchun Institute of Applied Chemistry, Chinese Academy of Sciences, Changchun (CN)

(*) Notice: Subject to any disclaimer, the term of this patent is extended or adjusted under 35 U.S.C. 154(b) by 18 days.

This patent is subject to a terminal disclaimer.

(21) Appl. No.: 15/522,598

(22) PCT Filed: Nov. 20, 2014

(86) PCT No.: PCT/CN2014/091786
§ 371 (c)(1),
(2) Date: Apr. 27, 2017

(87) PCT Pub. No.: WO2016/065681
PCT Pub. Date: May 6, 2016

(65) Prior Publication Data
US 2018/0248138 A1    Aug. 30, 2018

(30) Foreign Application Priority Data
Oct. 30, 2014    (CN) .......................... 2014 1 0605604

(51) Int. Cl.
*H01L 51/00*    (2006.01)
*H01L 51/52*    (2006.01)
(Continued)

(52) U.S. Cl.
CPC .......... *H01L 51/0089* (2013.01); *C09K 11/06* (2013.01); *H01L 51/0059* (2013.01);
(Continued)

(58) Field of Classification Search
None
See application file for complete search history.

(56) References Cited

U.S. PATENT DOCUMENTS 7,994,498 B2    8/2011  Pieh et al.
8,308,978 B2 *  11/2012  Marrocco, III ........ C08G 61/10
                                                      252/301.16
(Continued)

FOREIGN PATENT DOCUMENTS

CN    1438829 A    8/2003
CN    101752509 A    6/2010
(Continued)

OTHER PUBLICATIONS

"International Application No. PCT/CN2014/091786, International Search Report dated Jul. 24, 2015", w/ English Translation, (dated Jul. 24, 2015), 6 pgs.
(Continued)

*Primary Examiner* — Joseph Schoenholtz
(74) *Attorney, Agent, or Firm* — Schwegman Lundberg & Woessner, P.A.

(57) ABSTRACT

Provided is a white organic electroluminescent device, composed of a substrate, an anode layer, an anode modification layer, a hole transporting-electron blocking layer, a hole-dominated light-emitting layer, an electron-dominated light-emitting layer, a hole blocking-electron transporting layer, a cathode modification layer, and a cathode layer arranged in turn, wherein the electron-dominated light-emitting layer is composed of an organic sensitive material, a blue organic light-emitting material, and an electron-type organic host
(Continued)

material. A rare earth complex having a matched energy level, such as $Tm(acac)_3Phen$ or $Dy(acac)_3phen$ is selected as the organic sensitive material, and a trace amount of the same is doped into the electron-dominated light-emitting layer, which has the function of an energy transporting ladder and a deep binding center for charge carriers, so as to improve the light-emitting effectiveness, spectral stability, and service life of the device, reduce the operating voltage of the device, and delay the attenuation of the effectiveness of the device.

5 Claims, 2 Drawing Sheets

(51) Int. Cl.
*H01L 51/56* (2006.01)
*C09K 11/06* (2006.01)
*H01L 51/50* (2006.01)

(52) U.S. Cl.
CPC ...... *H01L 51/0067* (2013.01); *H01L 51/0085* (2013.01); *H01L 51/5028* (2013.01); *H01L 51/5036* (2013.01); *C09K 2211/1029* (2013.01); *C09K 2211/182* (2013.01); *H01L 51/001* (2013.01); *H01L 51/0023* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5206* (2013.01); *H01L 51/5221* (2013.01); *H01L 51/56* (2013.01); *H01L 2251/301* (2013.01); *H01L 2251/303* (2013.01); *H01L 2251/558* (2013.01)

(56) References Cited

U.S. PATENT DOCUMENTS

| | | | |
|---|---|---|---|
| 8,558,224 | B2 | 10/2013 | Aono et al. |
| 2004/0258956 | A1 | 12/2004 | Matsusue |
| 2010/0133522 | A1 | 6/2010 | Pieh et al. |
| 2012/0241725 | A1 | 9/2012 | Sawabe et al. |
| 2013/0146854 | A1 | 6/2013 | Dong |
| 2014/0203261 | A1 | 7/2014 | Choi et al. |
| 2015/0376337 | A1* | 12/2015 | Sergent ............... C08G 61/124 438/46 |
| 2017/0352824 | A1* | 12/2017 | Zhou ..................... H01L 51/56 |

FOREIGN PATENT DOCUMENTS

| | | | |
|---|---|---|---|
| CN | 102024909 | A | | 4/2011 |
| CN | 102694127 | A | | 9/2012 |
| CN | 102983288 | A | | 3/2013 |
| CN | 103022365 | A | * | 4/2013 |
| CN | 103022365 | A | | 4/2013 |
| CN | 103178212 | A | | 6/2013 |
| CN | 103219471 | A | | 7/2013 |
| CN | 103931009 | A | | 7/2014 |
| JP | 2010135689 | A | | 6/2010 |
| JP | 2012204412 | A | | 10/2012 |

OTHER PUBLICATIONS

"International Application No. PCT/CN2014/091786, Written Opinion dated Jul. 24, 2015", (dated Jul. 24, 2015), 3 pgs.
"U.S. Appl. No. 15/522,635, Preliminary Amendment filed Apr. 27, 2017", 26 pgs.
"International Application No. PCT/CN2014/091781, International Search Report dated Jul. 15, 2015", (dated Jul. 15, 2015), 3 pgs.
"International Application No. PCT/CN2014/091781, Written Opinion dated Jul. 15, 2015", (dated Jul. 15, 2015), 3 pgs.
"Japanese Application Serial No. 2017-523422, Office Action dated Jul. 2, 2018", (dated Jul. 2, 2018), 3 pgs.
He, Hong, "Interfacial exciplex electroluminescence between diamine derivatives with starburst molecular structure and tris(acetylacetonato)—(mono-phenothroline) thulium", Journal of Alloys and Compounds, 470, (2009), 6 pgs.
"European Application Serial No. 14904947.0, Extended European Search Report dated Jun. 5, 2018", (dated Jun. 5, 2018), 9 pgs.
"Japanese Application Serial No. 2017-523421, Non Final Office Action dated Jul. 9, 2018", w/English Translation, (dated Jul. 9, 2018), 5 pgs.
Chu, Miao-Tsai, et al., "Improving the performance of blue phosphorescent organic light-emitting devices using a composite emitter", Organic Electronics, (2009), 5 pgs.
Hong, Ziruo, et al., "Spectrally-narrow bluelight-emitting organic electroluminescent devices utilizing thulium complexes", Synthetic Metals 104, (1999), 4 pgs.
Hong, Ziruo, et al., "White light emission from OEL devices based on organic dysprosium-complex", Synthetic Metals 111-112, (2000), 3 pgs.
Zang, G X, et al., "1.4 um band electroluminescence from organic light-emitting diodes based on thulium complexes", Applied Physics Letters V84 No. 14, (Apr. 5, 2004), 4 pgs.

* cited by examiner

WHITE ORGANIC ELECTROLUMINESCENT DEVICE AND PREPARATION METHOD THEREOF

This application is a U.S. National Stage Filing under 35 U.S.C. 371 from International Application No. PCT/CN2014/091786, filed on 20 Nov. 2014, and published as WO2016/065681 on 6 May 2016, which claims the priority of Chinese Patent Application No. 201410605604.9, filed with SIPO on Oct. 30, 2014, entitled "WHITE ORGANIC ELECTROLUMINESCENT DEVICE AND PREPARATION METHOD THEREOF"; which applications and publication are incorporated herein by reference in their entirety.

FIELD OF THE INVENTION

This disclosure relates to the technical field of organic electroluminescence, and particularly to a white organic electroluminescent device and the preparation method thereof.

BACKGROUND OF THE INVENTION

An organic electroluminescent device is a device which spontaneously emits light, and the principle of light emission thereof is as follows. When charges are injected into an organic layer between a hole injection electrode and an electron injection electrode, electrons and holes encounter, combined, and then annihilated, and thus light is generated. Organic electroluminescent devices have the characteristics of low voltage, high brightness, wide view angle, or the like. Therefore, organic electroluminescent devices have been rapidly developed in recent years. Among these, the white organic electroluminescent devices have become hot spots of investigation due to the wide prospect for application in terms of display, illumination, or the like.

Trivalent iridium complexes are considered as ideal organic electroluminescent materials in both the academic world and the industrial world all the time due to the advantages of high light-emitting effectiveness, adjustable color of light emission, or the like. A number of domestic and foreign research teams have intended to improve the overall properties of the white organic electroluminescent devices by starting with aspects of material synthesis and device optimization so as to meet the requirement for industrialization. For Example, in 2006, Forrest et al at Princeton University in United States designed a white organic electroluminescent device having a structure with multiple light-emitting layers, by doping a blue light material, a green light material and a red light material in different light-emitting layers respectively. Although that device exhibits relatively ideal white light emission, the device has relatively low efficiency and brightness and relatively high working voltage, due to unbalanced carrier injection. Additionally, complex structure of the device further results in relatively high manufacturing cost of the device In order to solve these problems, in 2008, Kido et al at Yamagata University in Japan designed a structure of device having double light-emitting layers, to combine a blue-green light and an orange-red light, so as to obtain a white-light-emitting device successfully. That device has relatively high light-emitting effectiveness, but the feature of double-peak emission results in that the spectrum of the device does not have enough coverage degree in the white-light region, and thus the color restoration coefficient is relatively low. Further, as the brightness of the luminescence increases, the emission spectrum of the device varies greatly. As thus can be seen, the overall properties, such as light-emitting effectiveness, brightness, spectral stability, service life, and the like, of the white organic electroluminescent device are still not effectively improved.

SUMMARY

The technical problem to be solved by this disclosure is to provide a white organic electroluminescent device having relatively high overall properties and the preparation method thereof.

In view of this, this application provides a white organic electroluminescent device, comprising:

a substrate:

an anode layer provided on the substrate;

an anode modification layer provided on the anode layer;

a hole transporting-electron blocking layer provided on the anode modification layer;

a hole-dominated light-emitting layer provided on the hole transporting-electron blocking layer;

an electron-dominated light-emitting layer provided on the hole-dominated light-emitting layer;

a hole blocking-electron transporting layer provided on the electron-dominated light-emitting layer;

a cathode modification layer provided on the hole blocking-electron transporting layer; and a cathode layer provided on the cathode modification layer;

wherein the electron-dominated light-emitting layer is composed of an organic sensitive material, a blue organic light-emitting material, and an electron-type organic host material;

the hole-dominated light-emitting layer is composed of a green organic light-emitting material, a red organic light-emitting material and a hole-type organic host material;

the organic sensitive material is one or two selected from tris(acetylacetone)phenanthroline thulium and tris(acetylacetone)phenanthroline dysprosium; and the organic sensitive material is 0.1 wt %-0.5 wt % of the electron-type organic host material.

Preferably, the content of the blue organic light-emitting material is 8.0 wt %-25.0 wt % of the content of the electron-type organic host material.

Preferably, the blue organic light-emitting material is one or more selected from bis((3,5-difluoro-4-cyanophenyl)pyridinato)picolinate iridium, bis(2,4-difluorophenylpyridinato)tetrakis(1-pyrazolyl)borate iridium, tris(1-phenyl-3-methylbenzimidazolin-2-ylidene-C,C2') iridium, tris(1-phenyl-3-methylbenzimidazolin-2-ylidene-C,C2') iridium, bis(2,4-difluorophenylpyridinato)(5-(pyridin-2-yl)-1H-tetrazolate)iridium, tris[(2,6-diisopropylphenyl)-2-phenyl-1H-imidazol[e]iridium, tris(1-phenyl-3-methylimidazolin-2-ylidene-C,C(2)')iridium, tris(1-phenyl-3-methylimidazolin-2-ylidene-C,C(2)')iridium, bis(1-phenyl-3-methylimdazolin-2-ylidene-C,C$^{2'}$)(2-(2H-pyrazol-3-yl)-pyridine)iridium, bis(1-(4-methylphenyl)-3-methylimdazolin-2-ylidene-C,C$^{2'}$)(2-(2H-pyrazol-3-yl)-pyridine)iridium, bis(1-(4-fluorophenyl)-3-methylimdazoline-2-ylidene-C,C$^{2'}$)(2-(2H-pyrazol-3-yl)-pyridine)iridium, bis(1-(4-fluorophenyl)-3-methylimdazoline-2-ylidene-C,C$^{2'}$)(2-(5-trifluoromethyl-2H-pyrazol-3-yl)-pyridine)iridium, tris(1,3-diphenyl-benzimidazolin-2-ylidene-C,C$^{2'}$)iridium, bis(1-(4-fluorophenyl)-3-methylimdazoline-2-ylidene-C,C$^{2'}$)(3,5-dimethyl-2-(1H-pyrazol-5-yl)pyridine)iridium, bis(1-(4- methylphenyl)-3-methylimdazolin-2-ylidene-C,C²')(3,5-dimethyl-2-(1H-pyrazol-5-yl)pyridine)iridium, and tris(phenylpyrazole)iridium.

Preferably, the electron-type organic host material is one or more selected from 2,6-bis[3-(9H-9-carbazoyl)phenyl] pyridine, 1,4-bis(triphenylsilyl)benzene, 2,2'-bis(4-(9-carbazoyl)phenyl)biphenyl, tris[2,4,6-trimethyl-3-(3-pyridinyl)phenyl]borane, 1,3,5-tri[(3-pyridinyl)-3-phenyl]benzene, 1,3-bis[3,5-di(3-pyridinyl)phenyl]benzene, 1,3,5-tris(1-phenyl-1H-benzimidazol-2-yl)benzene, 9-(4-tert-butylphenyl)-3,6-bis(triphenylsilyl)-9H-carbazole, and 9-(8-diphenylphosphoryl)-dibenzo[b, d]furan-9H-carbazole.

Preferably, the red organic light-emitting material is 1.0 wt %-3.0 wt % of the hole-type organic host material; the green organic light-emitting material is 5.0 wt %-10.0 wt %0 of the hole-type organic host material;

the green organic light-emitting material is one or more selected from tris(2-phenylpyridine) iridium, bis(2-phenylpyridine)(acetylacetone) iridium, tris[2-(p-tolyl)pyridine]iridium, bis(2-phenylpyridine)[2-(diphen-3-yl)pyridine]iridium, tris(2-(3-paraxylene)pyridine iridium and tris (2-phenyl-3-methyl-pyridine) iridium, the red organic light-emitting material is one or more selected from bis(2-phenylquinoline)-(2,2,6,6-tetramethyl-3,5-heptanedionate) iridium, bis(2-benzo[b]-2-thiophenyl-pyridine)acetylacetone) iridium, tris(1-phenylisoquinoline) iridium, bis(1-phenylisoquinoline)acetylacetone) iridium, bis[1-(9,9-dimethyl-9H-fluoren-2-yl)-isoquinoline](acetylacetone) iridium, bis[2-(9,9-dimethyl-9H-fluoren-2-yl)-quinoline](acetylacetone) iridium, bis(2-phenylquinoline) (2-(3-tolyl)pyridine) iridium, tris[2-phenyl-4-methylquinoline]iridium, bis(phenylisoquinoline)(2,2,6,6-tetramethylhexane-3,5-dione) iridium, bis(2-methyldibenzo[f,h]quinoxaline)(acetylacetone) iridium, and bis[2-(2-methylphenyl)-7-methyl-quinoline](acetylacetone) iridium, and the hole-type organic host material is one or more selected from 4,4'-N,N'-dicarbazole-biphenyl, 1,3-dicarbazol-9-yl-benzene, 9,9'-(5-(triphenylsilyl)-1,3-phenyl)bis-9H-carbazole, 1,3,5-tris(9-carbazoyl)benzene, 4,4',4"-tris(carbazol-9-yl)triphenylamine, and 1,4-bis(triphenylsilyl)biphenyl.

Preferably, the material of the hole transporting-electron blocking layer is one or more selected from 4,4'-cyclohexylidenebis[N,N-bis(4-methylphenyl)aniline], dipyrazino[2,3-f:2',3'-h]quinoxaline-2,3,6,7,10,11-hexacarbonitrile, N4,N4'-di(naphthalene-1-yl)-N4,N4'-bis(4-vinylphenyl)biphenyl-4,4'-diamine, N,N'-bis(3-methylphenyl)-N,N'-bis (phenyl)-2,7-diamino-9,9-spirobifluorene, N,N,N',N'-tetra-(3-methylphenyl)-3-3'-dimethylbenzidine, 2,2'-bis(3-(N,N-di-p-tolylamino)phenyl)biphenyl. N,N'-bis(naphthalen-2-yl)-N,N'-bis(phenyl)benzidine, N,N'-bis(naphthalen-1-yl)-N,N'-diphenyl-2,7-diamino-9,9-spirobifluorene, N,N'-bis(3-methylphenyl)-N,N'-diphenyl-2,7-diamino-9,9-dimethylfluorene, N,N'-bis(naphthalen-1-yl)-N,N'-diphenyl-2,7-diamino-9,9-dimethylfluorene. N,N'-bis(3-methylphenyl)-N,N'-diphenyl-2,7-diamino-9,9-diphenylfluorene, N,N'-bis(naphthalen-1-yl)-N,N'-diphenyl-2,7-diamino-9,9-diphenylfluorene. N,N'-bis(naphthalen-1-yl)-N,N'-diphenyl-2,2'-dimethylbenzidine, 2,2',7,7'-tetrakis (N,N-diphenylamino)-2,7-diamino-9,9-spirobifluorene, 9,9-bis[4-(N,N-bis-naphthalen-2-yl-amino)phenyl]-9H-fluorene, 9.9-[4-(N-naphthalen-1-yl-N-anilino)-phenyl]-9H-fluorene, 2,2'-bis[N,N-bis(4-phenyl)amino]-9,9-spirobifluorene, 2,2'-bis(N,N-phenylamino)-9,9-spirobifluorene, N,N'-diphenyl-N,N'-(1-naphthyl)-1,1'-biphenyl-4,4'-diamine, and 4,4'-bis[N-(p-tolyl)-N-phenylamino]diphenyl.

Preferably, the material of the hole blocking-electron transporting layer is one or more selected from tris[2,4,6-trimethyl-3-(3-pyridinyl)phenyl]borane, 1,3,5-tri[(3-pyridinyl)-3-phenyl]benzene, 1,3-bis[3,5-di(3-pyridinyl)phenyl] benzene, and 1,3,5-tris(1-phenyl-1H-benzimidazol-2-yl) benzene.

Preferably, the anode modification layer has a thickness of 1-10 nm, the hole transporting-electron blocking layer has a thickness of 30-60 nm, the hole-dominated light-emitting layer has a thickness of 5-20 nm, the electron-dominated light-emitting layer has a thickness of 5-20 nm, the hole blocking-electron transporting layer has a thickness of 30-60 nm, the cathode modification layer has a thickness of 0.8-1.2 nm, and the cathode layer has a thickness of 90-300 nm.

This application further provides a preparation method of a bite organic electroluminescent device, comprising the steps of:

etching an anode layer on a substrate, and after drying, evaporation plating an anode modification laver, a hole transporting-electron blocking layer, a hole-dominated light-emitting layer, an electron-dominated light-emitting layer, a hole blocking-electron transporting layer, a cathode modification layer, and a cathode layer in turn on the anode layer, wherein a material of the electron-dominated light-emitting layer is composed of an organic sensitive material, a blue organic light-emitting material, and an electron-type organic host material;

the hole-dominated light-emitting layer is composed of a green organic light-emitting material a red organic light-emitting material and a hole-type organic host material;

the organic sensitive material is one or two selected from tris(acetylacetone)phenanthroline thulium and tris(acetylacetone)phenanthroline dysprosium; and the organic sensitive material is 0.1 wt %-0.5 wt % of the electron-type organic host material.

Preferably, the evaporation plating rate for the anode modification layer is 0.01-0.05 runts; the evaporation plating rates for the hole transporting-electron blocking layer, the host material in the hole-dominated light-emitting layer, the host material in the electron-dominated light-emitting layer, and the hole blocking-electron transporting layer are 0.05-0.1 nm/s; the evaporation plating rate for the organic sensitized material in the electron-dominated light-emitting layer is 0.00005-0.0005 nm/s; the evaporation plating rate for the blue organic light-emitting material in the electron-dominated light-emitting layer is 0.004-0.025 runts; the evaporation plating rate for the red light-emitting material in the hole-dominated light-emitting layer is 0.0005-0.003 nm/s; the evaporation plating rate for the green organic light-emitting materials in the hole-dominated light-emitting layer is 0.0025-0.01 nm/s; the evaporation plating rate for the cathode modification layer is 0.005-0.05 nm/s; and the evaporation plating rate for the cathode layer is 0.5-2.0 nm/s.

This application provides a white organic electroluminescent device, comprising: a substrate, an anode layer, an anode modification layer, a hole transporting-electron blocking layer, a hole-dominated light-emitting layer, an electron-dominated light-emitting layer, a hole blocking-electron transporting layer, a cathode modification layer, and a cathode layer. The light-emitting materials of this application are a blue light-emitting material, a green light-emitting material, and a red light-emitting material. When an electron and a hole are injected into a light-emitting layer respectively, the electron and the hole will encounter and be recombined to generate an exciton. The exciton will transfer the energy to a molecule of the light-emitting material in the light-emitting layer to excite an electron into the excited state. A photon will be generated when the electron in the excited state returns to the ground state in a manner of radiative transition. The light-emitting layers of the organic electroluminescent device contain light-emitting materials for the three primary colors, i.e. red, green and blue. When the doping concentrations of the light-emitting materials for the three colors come to an effective formulation, the proportion of the photons of these three colors will reach a balanced distribution close to the sunlight, and thereby white light emission occurs.

In this application, by adding one or two of tris(acetylacetone)phenanthroline thulium and tris(acetylacetone)phenanthroline dysprosium to the electron-dominated light-emitting layer as an organic sensitive material. Since the energy level and the triplet energy thereof match the energy levels and the triplet energies of the electron-type host material and the blue light-emitting material, so that the organic sensitive material has the function of an energy transporting ladder and a deep binding center for charge carriers in the process of electroluminescence. This not only improves the energy transfer from the host material to the light-emitting material, but also balances the distribution of electrons and holes in the range of light emission. Therefore, the light-emitting effectiveness of the organic electroluminescent device is improved, the spectral stability of the device is improved, the operating voltage of the device is reduced, the efficiency attenuation of the device is delayed, and the service life of the device is improved.

DETAILED DESCRIPTION

Figure 1:
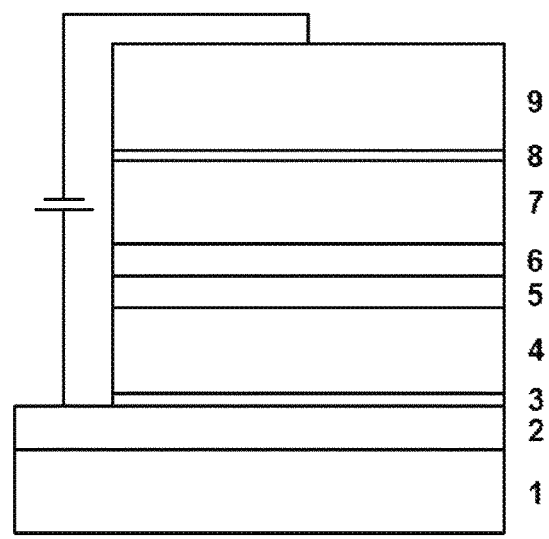
FIG. 1 is a structural schematic diagram of the white organic electroluminescent device of this disclosure.

In order to further understand this disclosure, the preferred embodiments of this disclosure are described below in conjunction with Examples. However, it is to be understood that these descriptions are only used to further illustrate characteristics and advantages of this disclosure, and are not limitations to the claims of this disclosure.

An embodiment of this disclosure discloses a white organic electroluminescent device, comprising:

a substrate;

an anode layer provided on the substrate;

an anode modification layer provided on the anode layer;

a hole transporting-electron blocking layer provided on the anode modification layer;

a hole-dominated light-emitting layer provided on the hole transporting-electron blocking layer;

an electron-dominated light-emitting layer provided on the hole-dominated light-emitting layer;

a hole blocking-electron transporting layer provided on the electron-dominated light-emitting layer;

a cathode modification layer provided on the hole blocking-electron transporting layer; and a cathode layer provided on the cathode modification layer;

wherein the electron-dominated light-emitting layer is composed of an organic sensitive material, a blue organic light-emitting material, and an electron-type organic host material;

the organic sensitive material is one or two selected from tris(acetylacetone)phenanthroline thulium and tris(acetylacetone)phenanthroline dysprosium; and the organic sensitive material is 0.1 wt %-0.5 wt % of the electron-type organic host material.

The principle of light emission of an organic electroluminescent device (OLED) is the phenomenon that an electron and a hole injected through electrodes encounter in an organic matter under the driving of an external voltage and the energy is transferred to an organic light-emitting molecule, which is excited to transit from the ground state to the excited state, and light emission is generated by the radiative transition when the excited molecule returns from the excited state to the ground state. This application provides a white organic electroluminescent device. When an electron and a hole are injected into a light-emitting layer respectively, the electron and the hole will encounter and be recombined to generate an exciton. The exciton transfers the energy to a molecule of the light-emitting material in the light-emitting layer to excite an electron into the excited state. A photon will be generated when the electron in the excited state returns to the ground state in a manner of transition. Since the light-emitting layers contain light-emitting materials for the three primary colors, i.e. red, green and blue, when the doping concentrations of the light-emitting materials for the three colors come to an effective formulation, the proportion of the photons of these three colors will reach a balanced distribution close to the sunlight, and thereby white light emission occurs.

The white organic electroluminescent device of this application is composed of a substrate, an anode layer, an anode modification layer, a hole transporting-electron blocking layer, a hole-dominated light-emitting layer, an electron-dominated light-emitting layer, a hole blocking-electron transporting layer, a cathode modification layer, and a cathode layer connected in turn. Here, the hole-dominated light-emitting layer and the electron-dominated light-emitting layer are the light-emitting layers of the white organic electronic light-emitting device.

The electron-dominated light-emitting layer of this disclosure is composed of an organic sensitive material, a blue organic light-emitting material, and an electron-type organic host material, wherein the organic sensitive material exerts an effect of sensitization in the process of electroluminescence to balance the distribution of electrons and holes in the range of light emission and improve the energy transfer from the host material to the light-emitting material; the molecules of the blue organic light-emitting material are dispersed in the electron-dominated light-emitting layer as luminescent centers; and the electron-type organic host material acts as a base material to provide the electron transporting capability. In the electron-dominated light-emitting layer, the energy level and the triplet energy of the organic sensitive material are required to match the energy levels and the triplet energies of the host material and the light-emitting material so as to balance the distribution of electrons and holes in the range of light emission and accelerate the energy transfer from the host material to the light-emitting material, so that the white organic electroluminescent device has good overall properties. Therefore, by the selection of the light-emitting material in this application, a rare earth complex having matched energy in energy levels is selected as the organic sensitive material. The organic sensitive material is one or two selected from tris(acetylacetone)phenanthroline thulium (Tm(acac)$_3$phen) having the structure of formula (IX) and tris(acetylacetone) phenanthroline dysprosium (Dy(acac)$_3$phen) having the structure of formula (X):

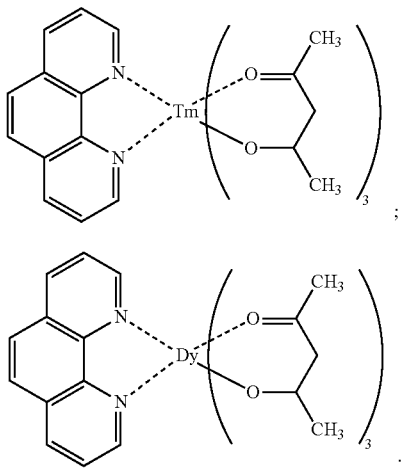

In this disclosure, the doping concentration of the organic sensitive material in the electron-dominated light-emitting layer influences the properties of the organic electroluminescent device. If the doping concentration of the organic sensitive material is too low, an undesirable effect of sensitization will be caused. If the doping concentration is too high, the overall properties of luminescence of the organic electroluminescent device will be reduced. Therefore, the organic sensitive material is 0.1 wt %-0.5 wt %, preferably 0.2 wt %-0.3 wt % of the electron-type organic host material.

According to this disclosure, organic light-emitting materials of the three primary colors are contained respectively in the electron-dominated light-emitting layer and the hole-dominated light-emitting layer, so that the organic electroluminescent device can emit white light. The organic light-emitting material in the electron-dominated light-emitting layer is a blue light-emitting material, the blue organic light-emitting material in the electron-dominated light-emitting layer is a light-emitting material which is well known by the person skilled in the art, and is not particularly limited in this application. However, in order for a better effect of light emission, the blue organic light-emitting material is preferably one or more selected from bis((3,5-difluoro-4-cyanophenyl)pyridinato)picolinate iridium (FCNIrpic) having the structure of formula (II$_1$), bis(2,4-difluorophenylpyridinato)tetrakis(1-pyrazolyl)borate iridium (Fir6) having the structure of formula (II$_2$), fac-Iridium tris(1-phenyl-3-methylbenzimidazolin-2-ylidene-C,C2') (fac-Ir(pmb)$_3$) having the structure of formula (II$_3$), mer-Iridium tris(1-phenyl-3-methylbenzimidazolin-2-ylidene-C,C2') (mer-Ir(Pmb)$_3$) having the structure of formula (II$_4$), bis(2,4-difluorophenylpyridinato)(5-(pyridin-2-yl)-1H-tetrazolate)iridium (FIrN4) having the structure of formula (II$_5$), fac-tris[(2,6-diisopropylphenyl)-2-phenyl-1H-imidazol[e] iridium (fac-Ir(iprprni)$_3$) having the structure of formula (II$_6$), fac-tris(1-phenyl-3-methylimidazolin-2-ylidene-C,C (2)')iridium (fac-Ir(pmi)$_3$) having the structure of formula (II$_7$), mer-tris(1-phenyl-3-methylimidazolin-2-ylidene-C,C (2)')iridium (mer-Ir(pmi)$_3$) having the structure of formula bis(1-phenyl-3-methylimdazolin-2-ylidene-C,C$^{2'}$)(2-(2H-pyrazol-3-yl)-pyridine)iridium ((pmi)$_2$Ir(pypz)) having the structure of formula (II$_9$), bis(1-(4-methylphenyl)-3-methylimdazolin-2-ylidene-C,C$^{2'}$)(2-(2H-pyrazol-3-yl)-pyridine)iridium ((mpmi)$_2$Ir(pypz)) having the structure of formula (II$_{10}$), bis(1-(4-fluorophenyl)-3-methylimdazoline-2-ylidene-C,C$^{2'}$)(2-(2H-pyrazol-3-yl)-pyridine)iridium ((fpmi)$_2$Ir(pypz)) having the structure of formula (II$_{11}$), bis(1-(4-fluorophenyl)-3-methylimdazoline-2-ylidene-C, C$^{2'}$)(2-(5-trifluoromethyl-2H-pyrazol-3-yl)-pyridine) iridium ((fpmi)$_2$Ir(tfpypz)) having the structure of formula (II$_{12}$), fac-tris(1,3-diphenyl-benzimidazolin-2-ylidene-C, C$^{2'}$)iridium (fac-Ir(dpbic)$_3$) having the structure of formula (II$_{13}$), bis(1-(4-fluorophenyl)-3-methylimdazoline-2-ylidene-C,C$^{2'}$)(3,5-dimethyl-2-(1H-pyrazol-5-yl)pyridine) iridium ((fpmi)$_2$Ir(dmpypz)) having the structure of formula (II$_{14}$), bis(1-(4-methylphenyl)-3-methylimdazolin-2-ylidene-C,C$^{2'}$)(3,5-dimethyl-2-(1H-pyrazol-5-yl)pyridine) iridium ((mpmi)$_2$Ir(dmpypz)) having the structure of formula (II$_{15}$) and tris(phenylpyrazole)iridium (Ir(ppz)$_3$) having the structure of formula (II$_{16}$):

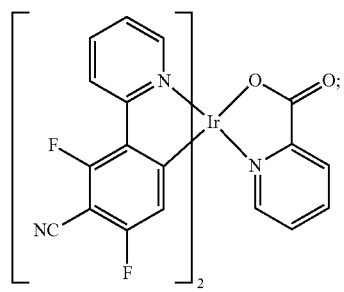

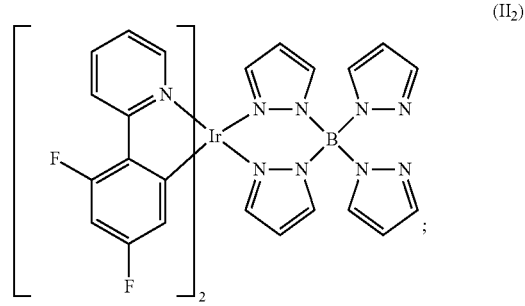

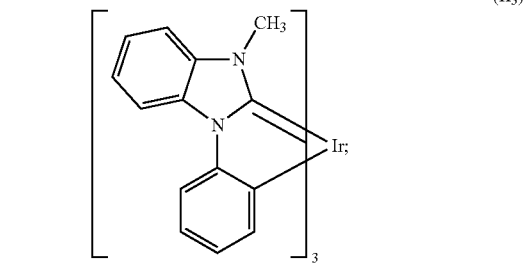

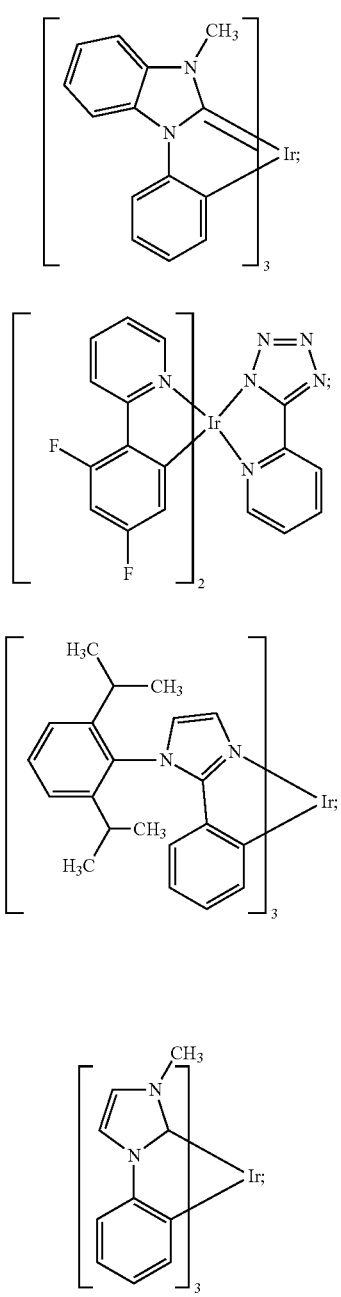

-continued

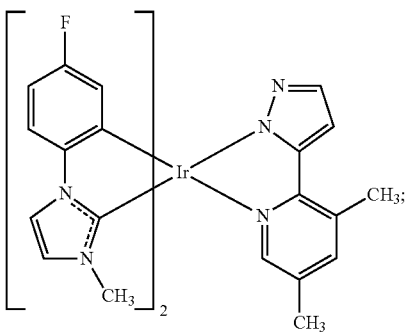
(II₁₄)

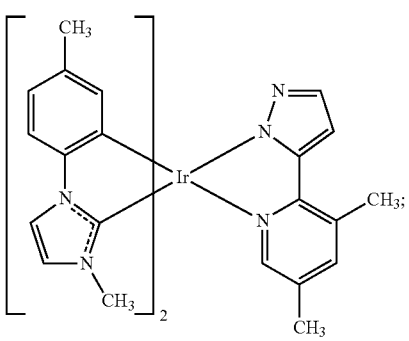
(II₁₅)

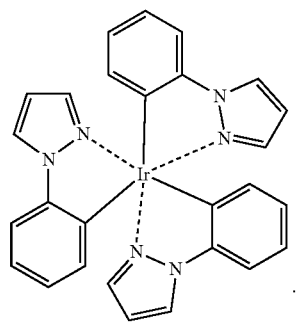
(II₁₆)

In the electron-dominated light-emitting layer, the doping concentration of the blue organic light-emitting material may also influence the overall properties of the white organic electroluminescent device. If the doping concentration of the blue organic light-emitting material is too low, relatively low efficiency and undesirable spectral stability of the device will be caused. If the doping concentration is too high, the agglomeration of molecules of the light-emitting material and the formation of quenching centers will be caused, and the overall properties of the device are finally reduced. Therefore, the doping concentration of the blue organic light-emitting material is preferably 8.0 wt %-25.0 wt %, more preferably 10.0 wt %-20.0 wt %, and most preferably 15.0 wt %-18.0 wt % of the electron-type organic host material. The electron-type host material in the electron-dominated light-emitting layer acts as a base material to provide the electron transporting capability. The electron-type host material is a material which is well known by the person skilled in the art. As a preferred embodiment, the electron-type host material is preferably one or more selected from 2,6-bis[3-(9H-9-carbazoyl)phenyl]pyridine (26DCzPPy) having the structure of formula (XI), 1,4-bis(triphenylsilyl)benzene (UGH2) having the structure of formula (XII), 2,2'-bis(4-(9-carbazoyl)phenyl)biphenyl (BCBP) having the structure of formula (XIII), tris[2,4,6-trimethyl-3-(pyridin-3-yl)phenyl]borane (3TPYMB) having the structure of formula (XIV), 1,3,5-tri[(3-pyridinyl)-3-phenyl]benzene (TmPvPB) having the structure of formula (XV), 1,3-bis[3,5-di(3-pyridinyl)phenyl]benzene (BmPyPhB) having the structure of formula (XVI), 1,3,5-tris(1-phenyl-1H-benzimidazol-2-yl)benzene (TPBi) having the structure of formula (XVII), 9-(4-tert-butylphenyl)-3,6-bis(triphenylsilyl)-9H-carbazole (CzSi) having the structure of formula (XVIII), and 9-(8-diphenylphosphoryl)-dibenzo[b,d]furan-9H-carbazole (DFCzPO) having the structure of formula (XIX):

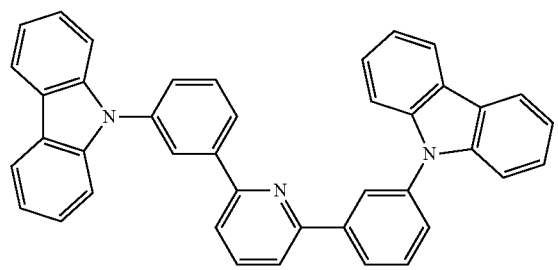
(XI)

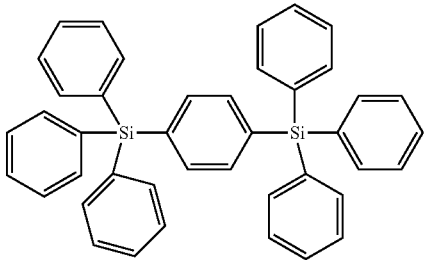
(XII)

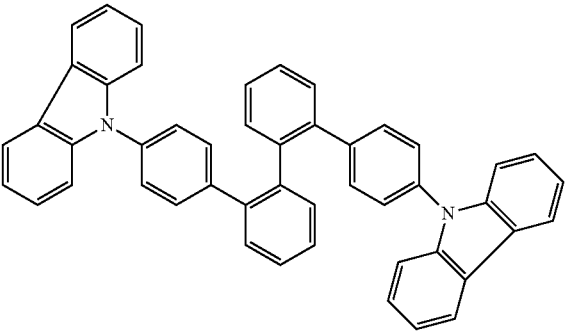
(XIII)

(XIV)

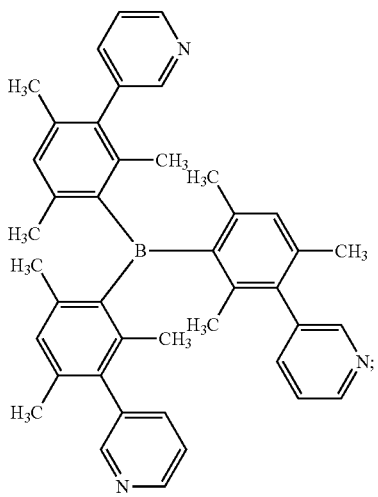

(XVII)

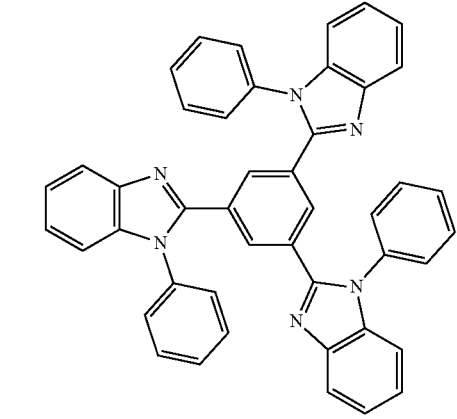
;

(XVIII)

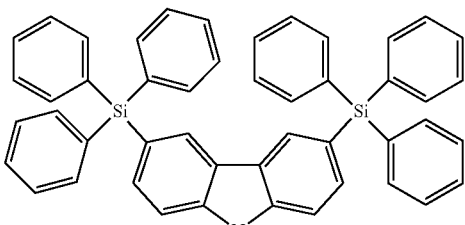
;

(XIX)

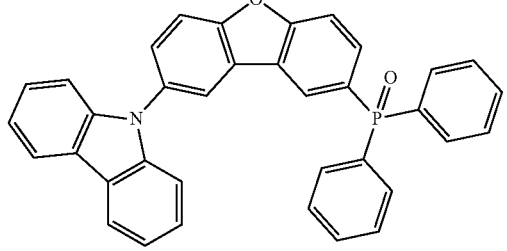
.

(XV)

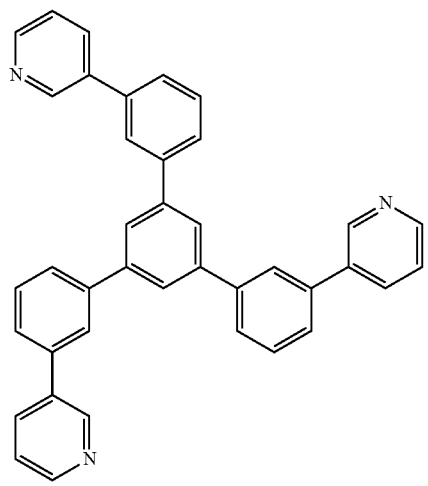
;

(XVI)

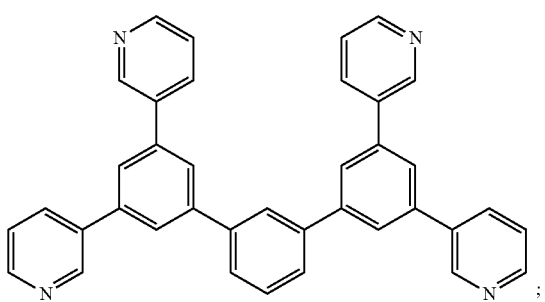
;

In this application, materials in the hole-dominated light-emitting layer are a red organic light-emitting material, a green organic light-emitting material, and a hole-type organic host material, wherein the molecules of the green organic light-emitting material and the red organic light-emitting material are dispersed in the hole-dominated light-emitting layer as luminescent centers. The organic light-emitting materials include a red organic light-emitting material, a green organic light-emitting material and a blue organic light-emitting material. In this application; the organic light-emitting material in the electron-dominated light-emitting layer is a blue light-emitting material, and the light-emitting materials in the hole-dominated light-emitting layer are a red organic light-emitting material and a green organic light-emitting material. The configuration of the light-emitting materials of different colors can improve the color restoration coefficient of the device and ensure the spectral stability of the device effectively. The red organic light-emitting material is preferably 1.0 wt %-3.0 wt % of the hole-type organic host material, and the green organic light-emitting material is preferably 5.0 wt %-10.0 wt % of the hole-type organic host material. If the doping concentration of the organic light-emitting material is too low, relatively low efficiency and undesirable spectral stability of the device will be caused. If the doping concentration is too high, the agglomeration of molecules of the light-emitting material and the formation of quenching centers will be caused, and the overall properties of the device are finally reduced. The hole-type host material acts as a base material to provide the hole transporting capability. In this application, in the hole-dominated light-emitting layer, the green organic light-emitting material is preferably one or more selected from tris(2-phenylpyridine) iridium (Ir(ppy)$_3$) having the structure of formula (II$_{17}$), bis(2-phenylpyridine)(acetylacetone) iridium (Ir(ppy)$_2$(acac)) having the structure of formula (II$_{18}$), tris[2-(p-tolyl)pyridine]iridium (Ir(mppy)$_3$) having the structure of formula (II$_{19}$), bis(2-phenylpyridine)[2-(diphen-3-yl)pyridine]iridium (Ir(ppy)$_2$(m-bppy)) having the structure of formula (II$_{20}$), tris(2-(3-paraxylene)pyridine iridium (TEG) having the structure of formula (II$_{21}$) and tris(2-phenyl-3-methyl-pyridine) iridium (Ir(3mppy)$_3$) having the structure of formula (II$_{22}$);

the red organic light-emitting material is preferably one or more selected from bis(2-phenylquinoline)-(2,2,6,6-tetramethyl-3,5-heptanedionate) iridium (PQ$_2$Ir(dpm)) having the structure of formula (II$_{23}$), bis(2-benzo[b]-2-thiophenyl-pyridine)(acetylacetonate) iridium (Ir(btp)$_2$(acac)) having the structure of formula (II$_{24}$), tris(1-phenylisoquinoline) iridium (Ir(piq)$_3$) having the structure of formula (II$_{25}$), bis(1-phenylisoquinoline)(acetylacetone) iridium (Ir(piq)$_2$(acac)) having the structure of formula (II$_{26}$), bis[1-(9,9-dimethyl-9H-fluoren-2-yl)-isoquinoline](acetylacetone) iridium (Ir(fliq)$_2$(acac)) having the structure of formula (II$_{27}$), bis[2-(9,9-dimethyl-9H-fluoren-2-yl)-quinoline](acetylacetone) iridium (Ir(flq)$_2$(acac)) having the structure of formula (II$_{28}$), bis(2-phenylquinoline)(2-(3-tolyl)pyridine) iridium (Ir(phq)$_2$tpy) having the structure of formula (II$_{29}$), tris[2-phenyl-4-methylquinoline]iridium (Ir(Mphq)$_3$) having the structure of formula (II$_{30}$), bis(phenylisoquinoline)(2,2,6,6-tetramethylhexane-3,5-dione) iridium (Ir(dpm)(piq)$_2$) having the structure of formula (II$_{31}$), bis(2-methyl-dibenzo[f,h]quinoxaline)(acetylacetone) iridium (Ir(MDQ)$_2$(acac)) having the structure of formula (II$_{32}$), and bis[2-(2-methylphenyl)-7-methyl-quinoline](acetylacetone) iridium (Ir(dmpq)$_2$(acac)) having the structure of formula (II$_{33}$);

the hole-type organic host material is preferably one or more selected from 4,4'-N,N'-dicarbazole-biphenyl (CBP) having the structure of formula (III), 1,3-dicarbazol-9-yl-benzene (mCP) having the structure of formula (IV), 9,9'-(5-(triphenylsilyl)-1,3-phenyl)bis-9H-carbazole (SimCP) having the structure of formula (V), 1,3,5-tris(9-carbazoyl)benzene (TCP) having the structure of formula (VI), 4,4',4"-tris(carbazol-9-yl)triphenylamine (TcTa) having the structure of formula (VII), and 1,4-bis(triphenylsilyl)biphenyl (BSB) having the structure of formula (VIII).

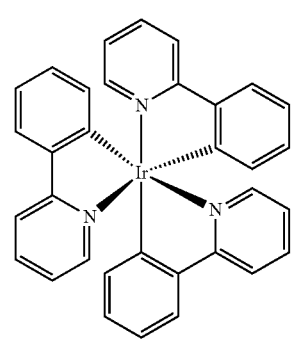
(II$_{17}$)

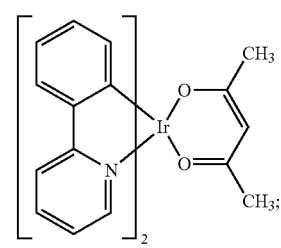
(II$_{18}$)

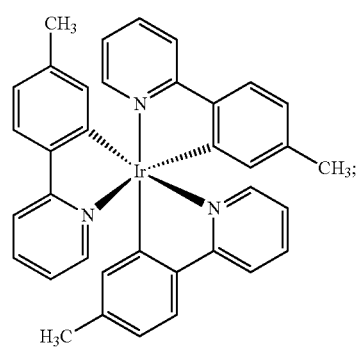
(II$_{19}$)

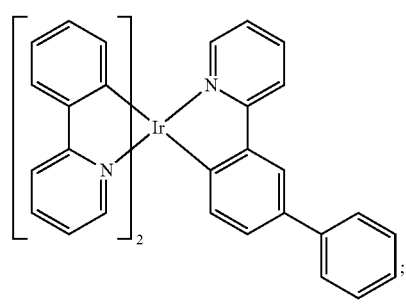
(II$_{20}$)

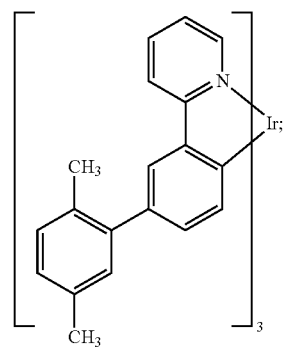
(II$_{21}$)

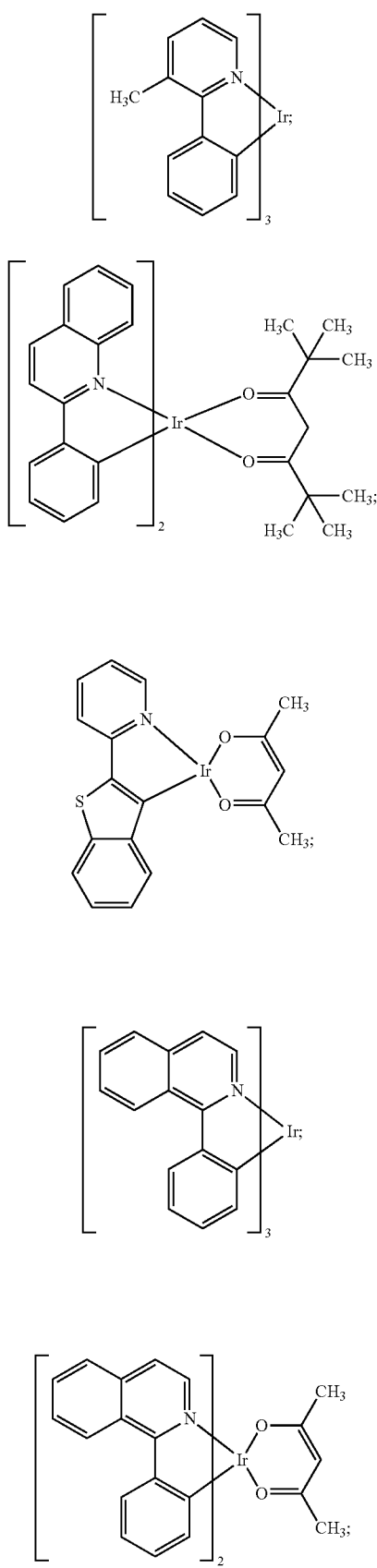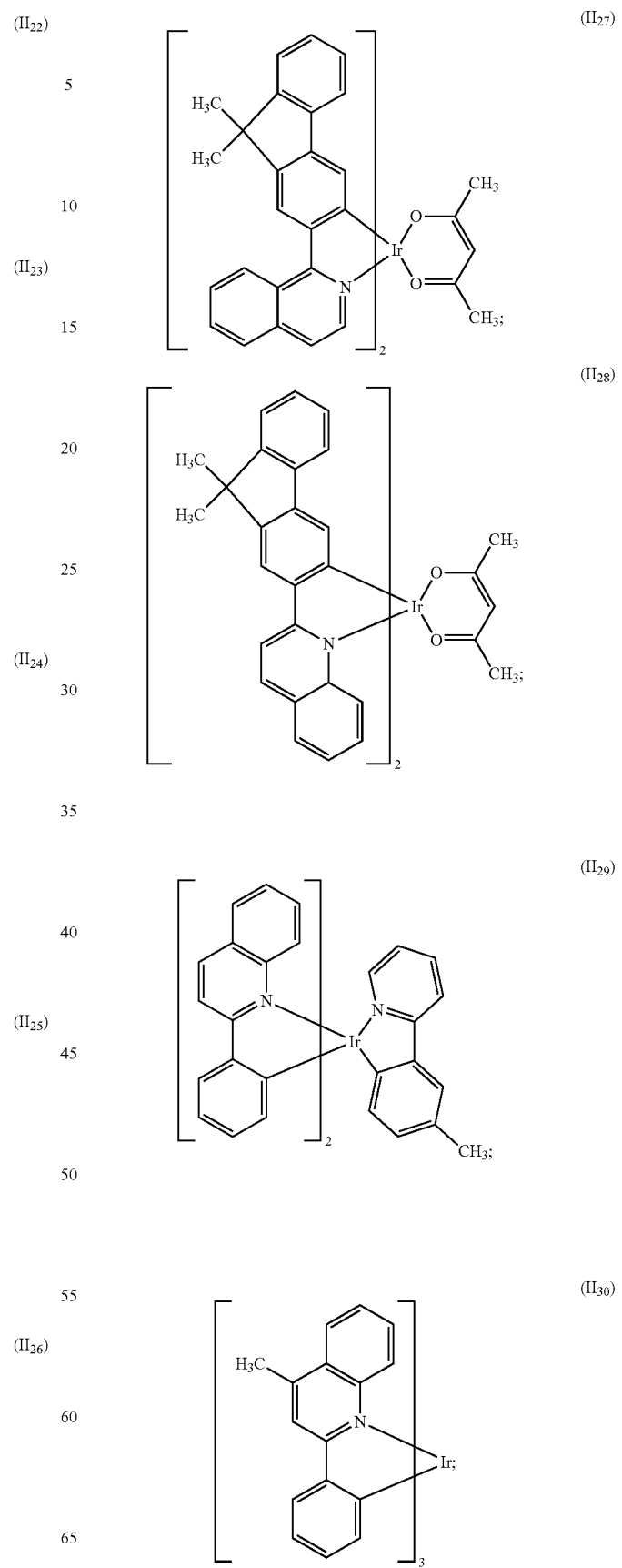

(II31)
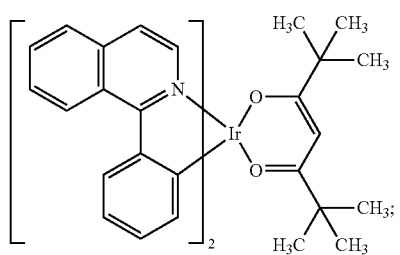
(II32)
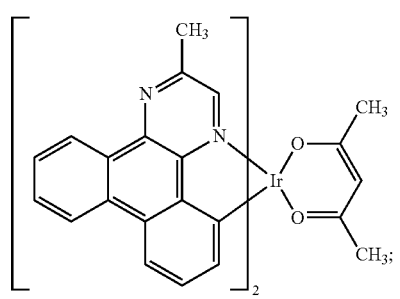
(II33)
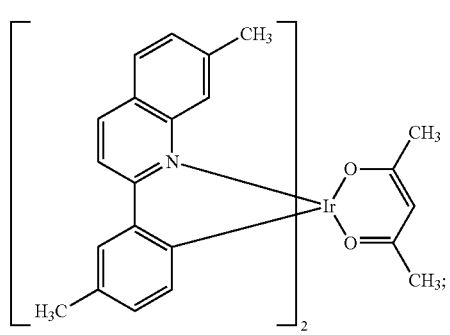
(III)
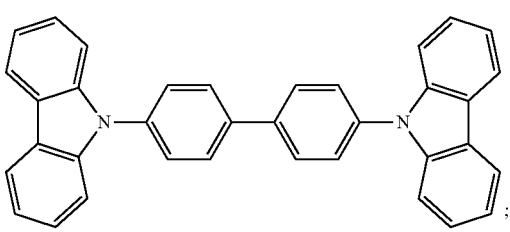
(IV)
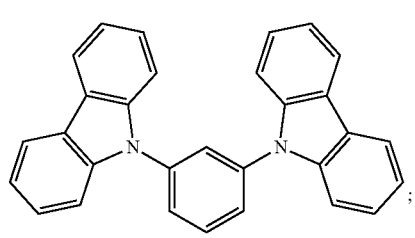
(V)
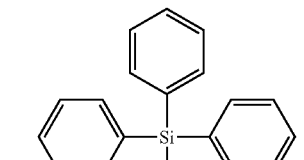
(VI)
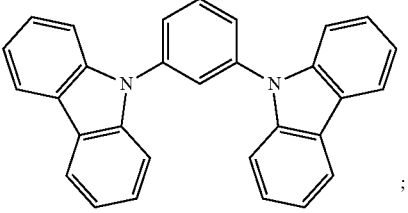
(VII)
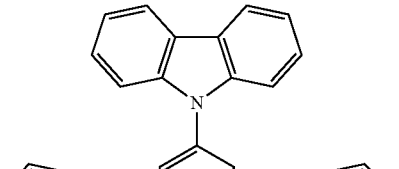
(VIII)
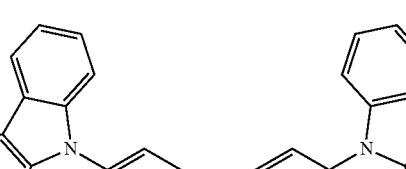
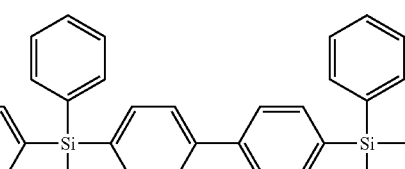
According to this disclosure, in the white organic electroluminescent device, the substrate may be a glass substrate, a quartz substrate, a polycrystalline silicon substrate, a monocrystalline silicon substrate, or a graphene thin-film substrate, and is not particularly limited in this application. The anode layer is preferably selected from indium tin oxide (ITO), which has a surface resistance of preferably 5-25Ω. The anode modification layer may reduce the drive voltage and accelerate the hole injection. Molybdenum oxide ($MoO_3$) is preferably used for the anode modification layer.

In this application, the function of the hole transporting-electron blocking layer is transporting holes and blocking electrons. The material of the hole transporting-electron blocking layer is preferably one or more selected from 4,4'-cyclohexylidenebis[N,N-bis(4-methylphenyl)aniline] (TAPC) having the structure of formula ($I_1$), dipyrazino[2,3-f:2',3'-h]quinoxaline-2,3,6,7,10,11-hexacarbonitrile (HAT-CN) having the structure of formula ($I_2$). N4,N4'-di(naphthalene-1-yl)-N4,N4'-bis(4-vinylphenyl)biphenyl-4,4'-diamine (VNPB) having the structure of formula ($I_3$), N,N'-bis(3-methylphenyl)-N,N'-bis(phenyl)-2,7-diamino-9,9-spirobifluorene (Spiro-TPD) having the structure of formula ($I_4$), N,N,N',N'-tetra-(3-methylphenyl)-3-3'-dimethyl-benzidine (HMTPD) having the structure of formula ($I_5$), 2,2'-bis(3-(N,N-di-p-tolylamino)phenyl)biphenyl (3DTAPBP) having the structure of formula ($I_6$). N,N'-bis(naphthalen-2-yl)-N,N'-bis(phenyl)benzidine (β-NPB) having the structure of formula ($I_7$), N,N'-bis(naphthalen-1-yl)-N,N'-diphenyl-2,7-diamino-9,9-spirobifluorene (Spiro-NPB) having the structure of formula ($I_8$), N,N'-bis(3-methylphenyl)-N,N'-diphenyl-2,7-diamino-9,9-dimethylfluorene (DMFL-TPD) having the structure of formula ($I_9$), N,N'-bis(naphthalen-1-yl)-N,N'-diphenyl-2,7-diamino-9,9-dimethylfluorene (DMFL-NPB) having the structure of formula ($I_{10}$), N,N'-bis(3-methylphenyl)-N,N'-diphenyl-2,7-diamino-9,9-diphenylfluorene (DPFL-TPD) having the structure of formula (In), N,N'-bis(naphthalen-1-yl)-N,N'-diphenyl-2,7-diamino-9,9-diphenylfluorene (DPFL-NPB) having the structure of formula ($I_{12}$), N,N'-bis(naphthalen-1-yl)-N,N'-diphenyl-2,2'-dimethylbenzidine (α-NPD) having the structure of formula ($II_3$), 2,2',7,7'-tetrakis(N,N-diphenylamino)-2,7-diamino-9,9-spirobifluorene (Spiro-TAD) having the structure of formula ($I_{14}$), 9,9-bis[4-(N,N-bis-naphthalen-2-yl-amino)phenyl]-9H-fluorene (NPAPF) having the structure of formula ($I_{15}$), 9,9-[4-(N-naphthalen-1-yl-N-anilino)-phenyl]-9H-fluorene (NPBAPF) having the structure of formula ($I_{16}$), 2,2'-bis[N,N-bis(4-phenyl)amino]-9,9-spirobifluorene (2,2'-Spiro-DBP) having the structure of formula ($I_{17}$), 2,2'-bis(N,N-phenylamino)-9,9-spirobifluorene (Spiro-BPA) having the structure of formula ($I_{18}$), N,N'-diphenyl-N,N'-(1-naphthyl)-1,1'-biphenyl-4,4'-diamine (NPB) having the structure of formula ($I_{19}$), and 4,4-bis[N-(p-tolyl)-N-phenyl-amino]diphenyl (TPD) having the structure of formula ($I_{20}$).

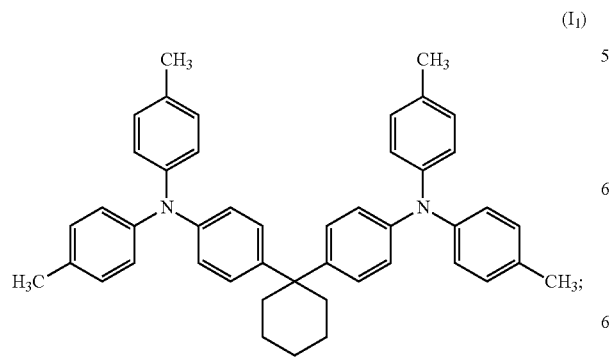

($I_1$)

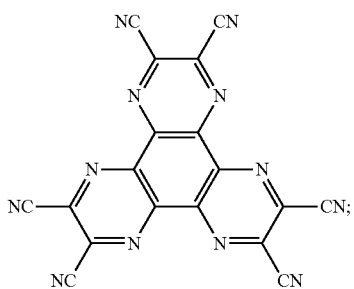

($I_2$)

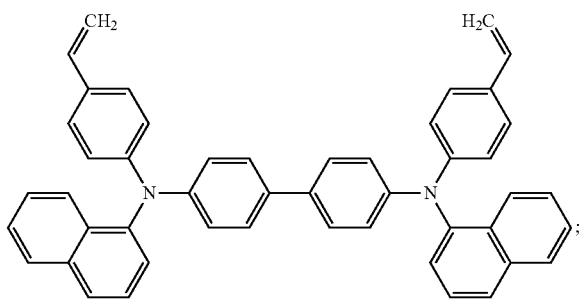

($I_3$)

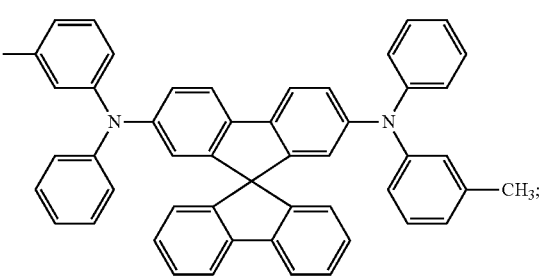

($I_4$)

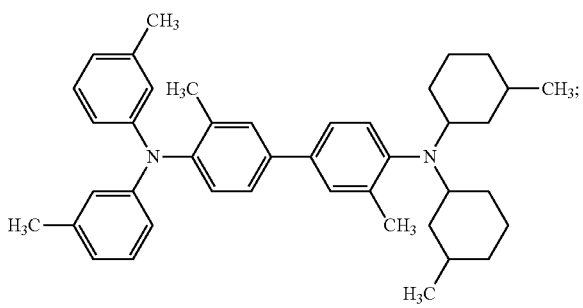

($I_5$)

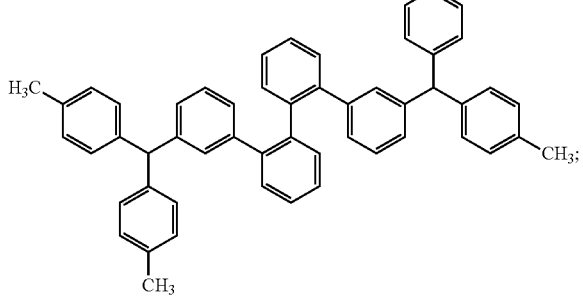

($I_6$)

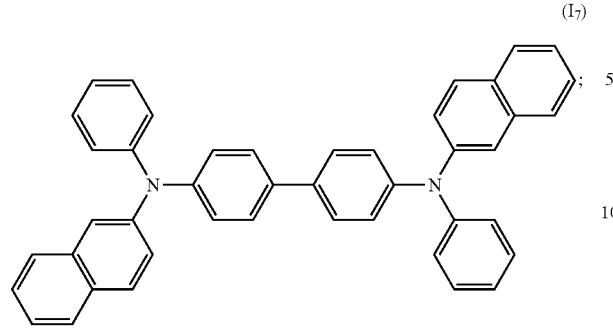
(I₇)
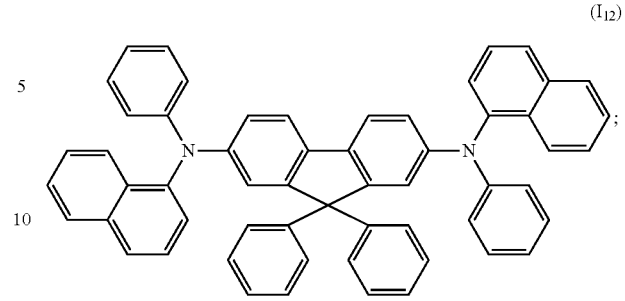
(I₁₂)
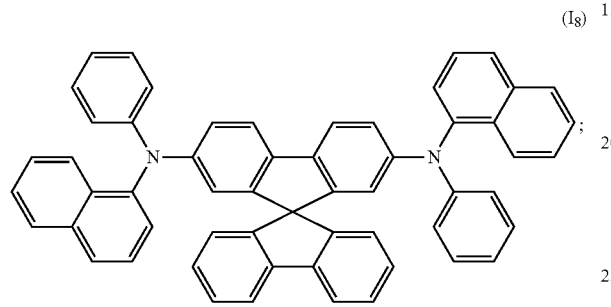
(I₈)
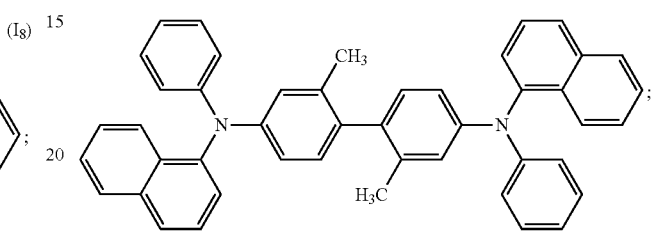
(I₁₃)
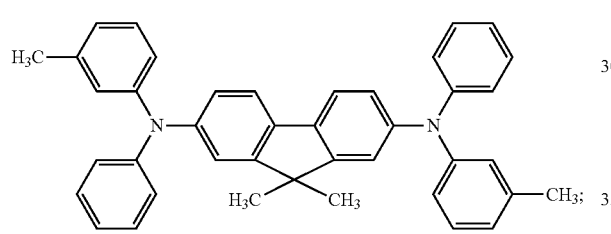
(I₉)
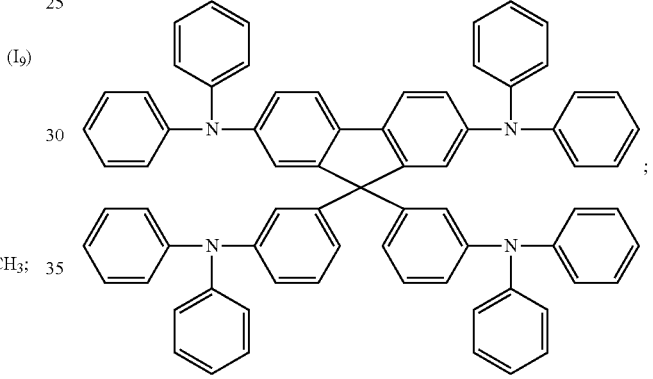
(I₁₄)
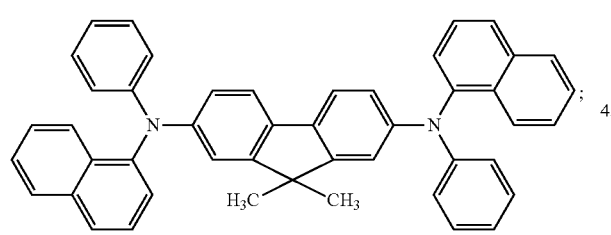
(I₁₀)
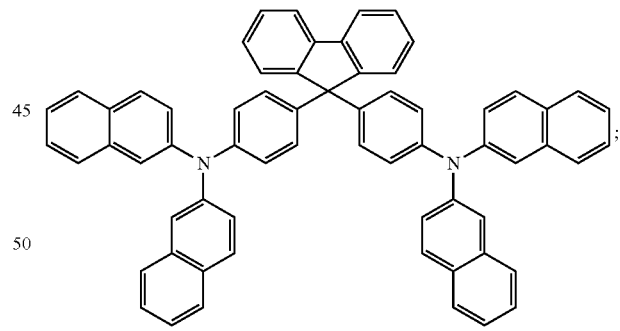
(I₁₅)
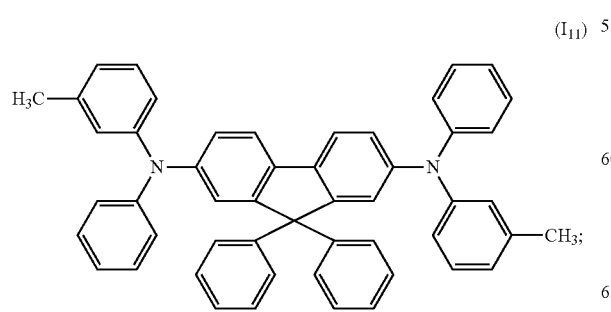
(I₁₁)
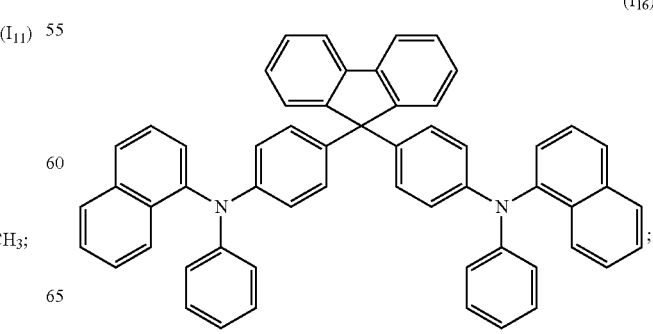
(I₁₆)

(I₁₇)

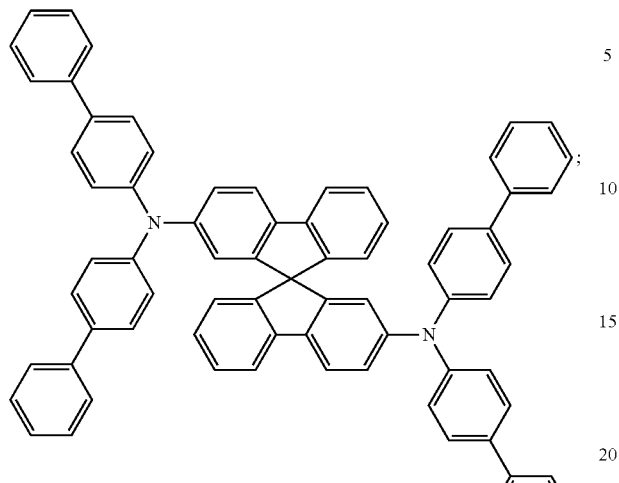

(I₁₈)

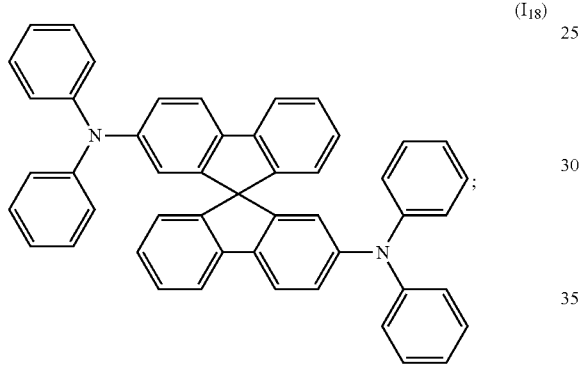

(I₁₉)

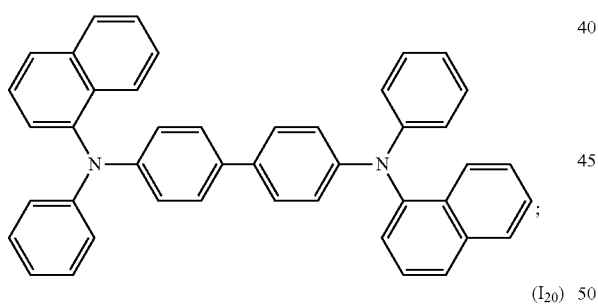

(I₂₀)

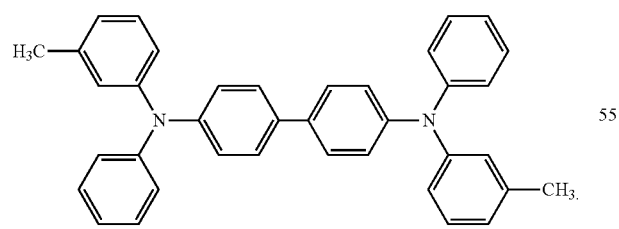

(TmPyMB) having the structure of formula (XV), 1,3-bis[3,5-di(3-pyridinyl)phenyl]benzene (BmPyPhB) having the structure of formula (XVI), and 1,3,5-tris(1-phenyl-1H-benzimidazol-2-yl)benzene (TPBi) having the structure of formula (XVII):

(XIV)

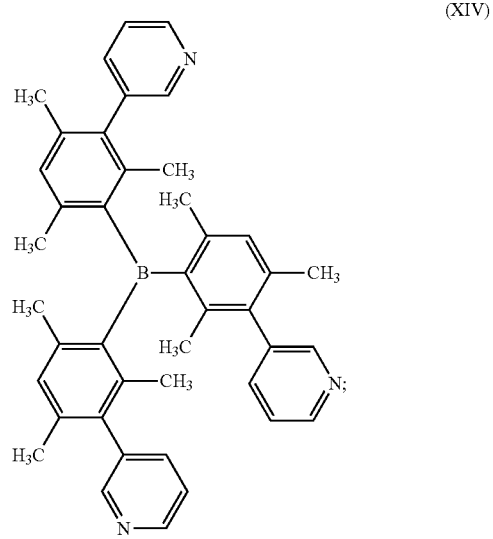

(XV)

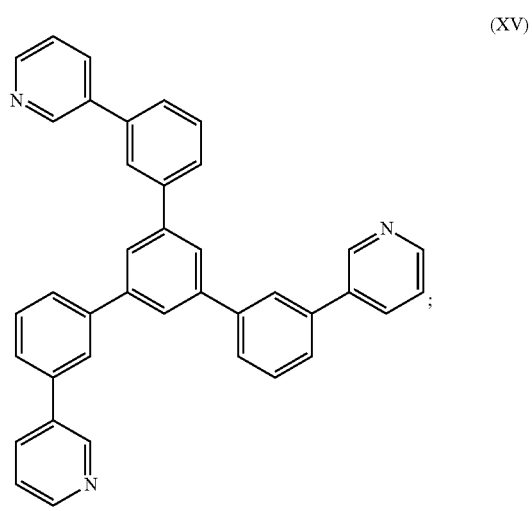

(XVI)

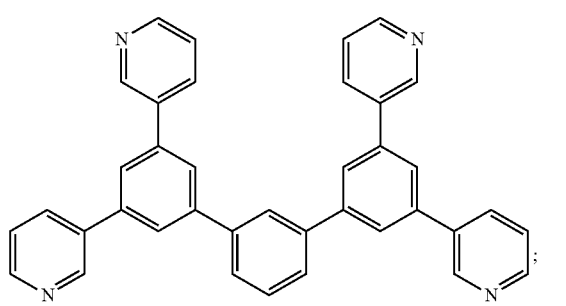

According to this disclosure, the function of the hole blocking-electron transporting layer is transporting electrons and blocking holes to promote the electron injection. The material of the hole blocking-electron transporting layer is preferably one or more selected from tris[2,4,6-trimethyl-3-(3-pyridinyl)phenyl]borane (3TPYMB) having the structure of formula (XIV), 1,3,5-tri[(3-pyridinyl)-3-phenyl]benzene -continued (XVII)

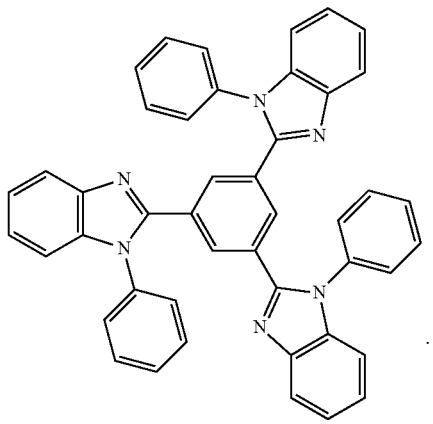

In this application, the sources of the material of the hole transporting-electron blocking layer, the blue organic light-emitting material, the red organic light-emitting material, the green organic light-emitting material, the hole-type organic host material, the organic sensitive material, the electron-type organic host material, and the material of the hole blocking-electron transporting layer are not particularly limited, and they may be obtained by the preparation in a manner well known by the person skilled in the art.

In this application, the anode layer and the cathode layer are overlapped with each other to form a light-emitting zone. The thickness of each layer in the white organic electroluminescent device of this application has significant effect on the device. If the thickness is too small, it will result in faster attenuation of the device efficiency. If the thickness is too large, it will result in high operating voltage and short service life of the device. Therefore, the thickness of the anode modification layer is preferably 1-10 nm, the thickness of the hole transporting-electron blocking layer is preferably 30-60 nm, the thickness of the hole-dominated light-emitting layer is preferably 5-20 nm, the thickness of the electron-dominated light-emitting layer is preferably 5-20 nm, the thickness of the hole blocking-electron transporting layer is preferably 30-60 nm, the thickness of the cathode modification layer is preferably 0.8-1.2 nm, and the thickness of the cathode layer is preferably 90-300 nm.

This application further provides a preparation method of the white organic electroluminescent device, comprising the steps of:

etching an anode layer on a substrate, and after drying, evaporation plating an anode modification layer, a hole transporting-electron blocking layer, a hole-dominated light-emitting layer, an electron-dominated light-emitting layer, a hole blocking-electron transporting layer, a cathode modification layer, and a cathode layer in turn on the anode layer, wherein the electron-dominated light-emitting layer is formed by mixing an organic sensitive material, a blue organic light-emitting material, and an electron-type organic host material;

wherein the hole-dominated light-emitting layer is formed by mixing a green organic light-emitting material, a red organic light-emitting material, and a hole-type organic host material;

the organic sensitive material is one or two selected from tris(acetylacetone)phenanthroline thulium and tris(acetylacetone)phenanthroline dysprosium; and the organic sensitive material is 0.1 wt %-0.5 wt % of the electron-type organic host material.

According to this disclosure, the preparation method of the white organic electroluminescent device is specifically as follows:

An anode layer on a substrate is firstly laser-etched into a strip electrode, then ultrasonically cleaned sequentially with a cleaning liquid and deionized water for 10-20 min, and placed in an oven for drying;

the dried substrate is placed in a pretreating vacuum chamber, subjected to low-pressure plasma treatment for 1-10 min under a vacuum atmosphere of 8-15 Pa with a voltage of 350-500V, and then transferred to an organic evaporation plating chamber;

upon the vacuum degree reaches $1-2 \times 10^{-5}$ Pa, an anode modification layer, a hole transporting-electron blocking layer, a hole-dominated light-emitting layer, an electron-dominated light-emitting layer, and a hole blocking-electron transporting layer are sequentially, evaporation plated on the anode layer; and the uncompleted device is transferred to a metal evaporation plating chamber, and a cathode modification layer and a metal cathode layer are sequentially evaporation plated under a vacuum atmosphere of $4-6 \times 10^{-5}$ Pa.

In the process of preparing the white organic electroluminescent device of this application, the deposition of the material is achieved by controlling the evaporation plating r According to this disclosure, the evaporation plating rate for the anode modification layer is controlled at 0.01-0.05 nm/s; the evaporation plating rates for the hole transporting-electron blocking layer, the host material in the hole-dominated light-emitting layer, the host material in the electron-dominated light-emitting layer, and the hole blocking-electron transporting layer are controlled at 0.05-0.1 nm/s; the evaporation plating rate for the organic sensitive material is controlled at 0.00005-0.0005 nm/s; the evaporation plating rate for the green organic light-emitting material is controlled at 0.0025-0.01 nm/s; the evaporation plating rate for the blue organic light-emitting material is controlled at 0.004-0.025 nm/s; the evaporation plating rate for the red organic light-emitting material is controlled at 0.0005-0.003 nm/s; the evaporation plating rate for the cathode modification layer is controlled at 0.005-0.05 nm/s; and the evaporation plating rate for the metal cathode layer is controlled at 0.5-2.0 nm/s. Here, when the hole-dominated light-emitting layer is evaporation plated, the red organic light-emitting material, the green organic light-emitting material and the hole-type organic host material are evaporation plated from different evaporating sources at the same time, the weight ratio of the doped red organic light-emitting material to the hole-type organic host material is allowed to be controlled between 1.0%-3.0%, and the weight ratio of the green organic light-emitting material to the hole-type organic host material is allowed to be controlled between 5.0%-10.0%, by regulating the evaporation plating rates of these three materials. When the electron-dominated light-emitting layer is evaporation plated, the organic sensitive material, the blue organic light-emitting material, and the electron-type organic host material are evaporation plated from different evaporating sources at the same time, and the mass ratio of the doped organic sensitive material to the electron-type organic host material is allowed to be controlled between 0.1%-0.5% and the mass ratio of the doped blue organic light-emitting material to the electron-type organic host material is allowed to be controlled between 8.0%-25.0% by regulating the evaporation plating rates of these three materials.

This application provides a white organic electroluminescent device. In the electron-dominated light-emitting layer of the white organic electroluminescent device, a rare earth complex having a matched energy level distribution, for Example Tm(acac)$_3$ or Dy(acac)$_3$phen, is selected as the organic sensitive material, which has the function of a deep binding center for charge carriers. This is advantageous to balance the distribution of carriers and widen the range of light emission of the device, so that the light-emitting effectiveness of the device is improved, the operating voltage of the device is reduced, the efficiency attenuation of the device is delayed, and the service life of the device is improved. Furthermore, the organic sensitive material has a matched triplet energy, which has the function of an energy transfer ladder. This can accelerate the energy transfer from the host material to the light-emitting material and alleviate the problem of light emission of the host material caused by insufficient capability of carrier capture of the light-emitting material. Therefore, the spectral stability of the device is improved, and the dependence of the properties of the device on the doping concentration of the light-emitting material is reduced.

In order to further understand this disclosure, the white organic electroluminescent device and the preparation method thereof provided by this disclosure are described in detail below in conjunction with Examples. The protection scope of this disclosure is not limited by the following Examples.

As shown in FIG. 1, FIG. 1 is a structural schematic diagram of the white organic electroluminescent device of this disclosure, wherein 1 is a glass substrate, 2 is an anode layer, 3 is an anode modification layer, 4 is a hole transporting-electron blocking layer, 5 is a hole-dominated light-emitting layer, 6 is an electron-dominated light-emitting layer, 7 is a hole blocking-electron transporting layer, 8 is a cathode modification layer, and 9 is a metal cathode layer.

Example 1

An ITO anode layer on an ITO glass was laser-etched into a strip electrode, then ultrasonically cleaned sequentially with a cleaning liquid and deionized water for 15 min. and placed in an oven for drying. The dried substrate was then placed in a pretreating vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of $1-2\times10^{-5}$ Pa, a MoO$_3$ anode modification layer 3 having a thickness of 3 nm, a TAPC hole transporting-electron blocking layer 4 having a thickness of 40 nm, a TcTa hole-dominated light-emitting layer 5 doped with PQ$_2$Ir(dpm) and Ir(ppy)$_3$ having a thickness of 10 nm, a CzSi electron-dominated light-emitting layer 6 co-doped with Tm(acac)$_3$phen and FCNIrpic having a thickness of 10 nm, and a TmPyPB hole blocking-electron transporting layer 7 having a thickness of 40 nm were sequentially evaporated on the ITO layer. Next, the uncompleted device was transferred to a metal evaporation plating chamber, and a LiF cathode modification layer 8 having a thickness of 1.0 nm was evaporated under a vacuum atmosphere of 4-6×10-Pa. Finally, a metal Al cathode layer 9 having a thickness of 120 nm was evaporated on the LiF layer through a specially-made mask plate to prepare an organic electroluminescent device having a structure of ITO/MoO$_3$/TAPC/PQ$_2$Ir(dpm)(2.6%):Ir(ppy)$_3$(7%)TcTa/ Tm(acac)$_3$phen(0.2%):FCNIrpic(18%):CzSi/TmPyPB/LiF/ Al. The evaporation plating rate for MoO$_3$ in the anode modification layer 3 was controlled at 0.01 nm/s, the evaporation plating rate for TAPC in the hole transporting-electron blocking layer 4 was controlled at 0.05 nm/s, the evaporation plating rates for PQ$_2$Ir(dpm), Ir(ppy)$_3$ and TcTa in the hole-dominated light-emitting layer 5 were controlled at 0.0013 nm/s, 0.0035 nm/s and 0.05 nm/s respectively, the evaporation plating rates for Tm(acac)$_3$phen, FCNIrpic, and CzSi in the electron-dominated light-emitting layer 6 were controlled at 0.0001 nm/s, 0.0035 nm/s, and 0.05 nm/s respectively, the evaporation plating rate for TmPyPB in the hole blocking-electron transporting layer 7 was controlled at 0.05 nm/s, the evaporation plating rate for LiF in the cathode modification layer 8 was controlled at 0.01 nm/s, and the evaporation plating rate for Al in the metal cathode layer 9 was controlled at 1.0 nm/s.

Figure 2:
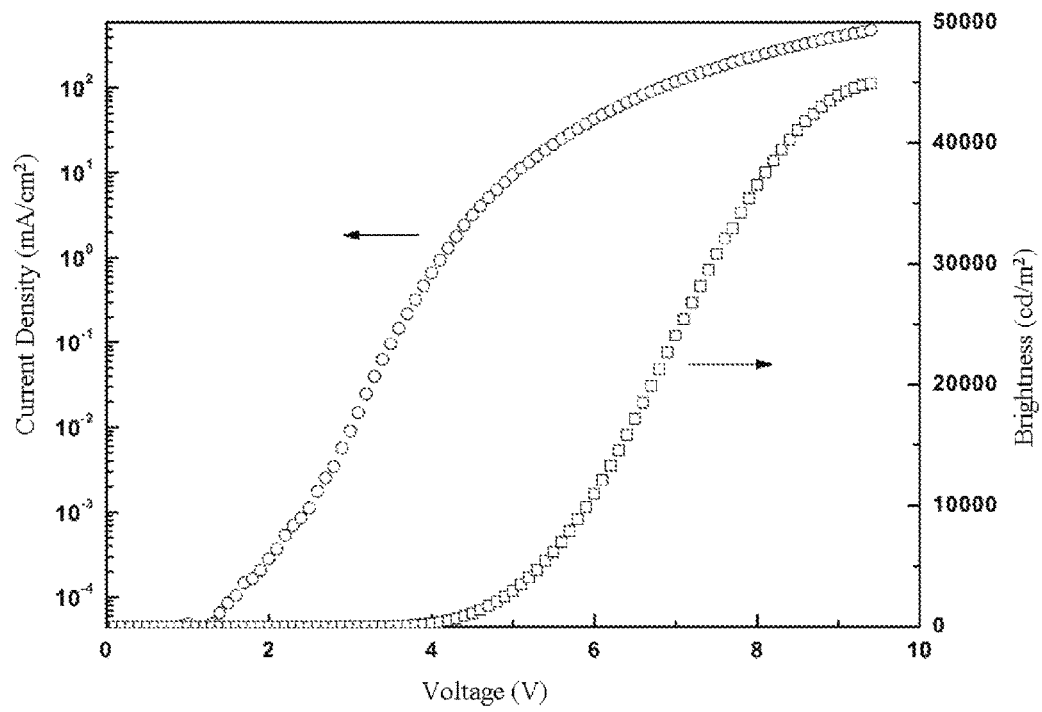
FIG. 2 is a plot of the characteristics of voltage-current density-brightness of the white organic electroluminescent device prepared in Example 1 of this disclosure.

As shown in FIG. 2, FIG. 2 shows the curves of characteristics of voltage-current density-brightness of the white organic electroluminescent device prepared in this Example. In FIG. 2, the ○ curve was a current density-voltage curve of the device, and the □ curve was a brightness-voltage curve of the device. It can be seen from FIG. 2 that the brightness of the device increased as the current density and the drive voltage increased, the turn-on voltage of the device was 3.0 volts, and the maximal brightness of 44899 candelas per square meter (cd/m$^2$) of the device was obtained when the voltage was 9.4 volts and the current density was 484.56 milliamperes per square centimeter (mA/cm$^2$).

Figure 3:
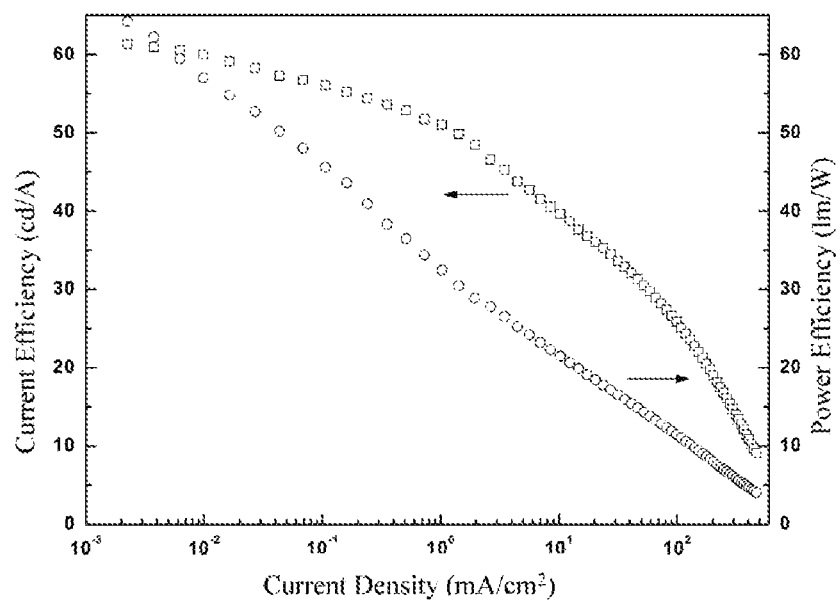
FIG. 3 is a plot of the characteristics of current density-power efficiency-current efficiency of the white organic electroluminescent device prepared in Example 1 of this disclosure.

As shown in FIG. 3, FIG. 3 shows the curves of characteristics of current density-power efficiency-current efficiency of the white organic electroluminescent device prepared in this Example. It can be seen from FIG. 3 that the maximal current efficiency of the device was 61.32 cd/A and the maximal power efficiency was 64.18 lm/nW.

Figure 4:
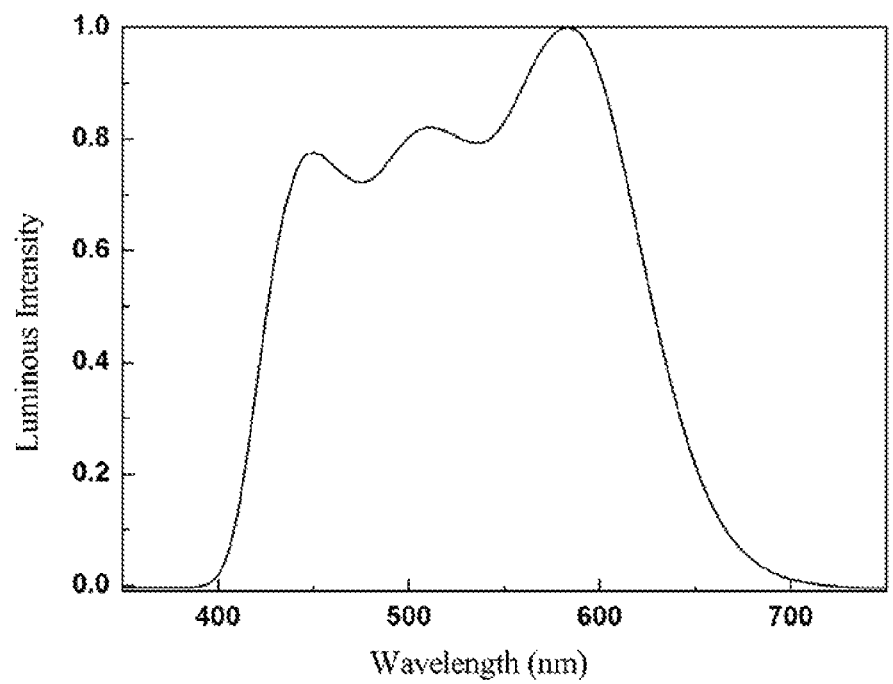
FIG. 4 is a spectrogram of the white organic electroluminescent device prepared in Example 1 of this disclosure when the brightness is 20000 cd/m$^2$.

As shown in FIG. 4, FIG. 4 shows a spectrogram of the white organic electroluminescent device provided by this disclosure when the brightness was 20000 cd/m$^2$. It can be seen from FIG. 4 that the main peaks of the spectrum were located at 462 nanometers, 515 nanometers and 595 nanometers. The color coordinate of the device was (0.331, 0.332).

Example 2

An ITO anode layer on an ITO glass was laser-etched into a strip electrode, then ultrasonically cleaned sequentially with a cleaning liquid and deionized water for 15 min, and placed in an oven for drying. The dried substrate was then placed in a pretreating vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of $1-2\times10^{-5}$ Pa, a MoO$_3$ anode modification layer 3 having a thickness of 3 nm, a TAPC hole transporting-electron blocking layer 4 having a thickness of 40 nm, a mCP hole-dominated light-emitting layer 5 doped with PQ$_2$Ir(dpm) and Ir(ppy)$_3$ having a thickness of 10 nm, a CzSi electron-dominated light-emitting layer 6 co-doped with Tm(acac)$_3$phen and FCNIrpic having a thickness of 10 nm, and a TmPyPB hole blocking-electron transporting layer 7 having a thickness of 40 nm were sequentially evaporated on the ITO layer. Next, the uncompleted device was transferred to a metal evaporation plating chamber, and a LiF cathode modification layer 8 having a thickness of 1.0 nm was evaporated under a vacuum atmosphere of $4-6\times10^{-5}$ Pa. Finally, a metal Al cathode layer 9 having a thickness of 120 nm was evaporated on the LiF layer through a specially-made mask plate to prepare an organic electroluminescent device having the structure of ITO/MoO$_3$/TAPC/PQ$_2$Ir(dpm)(2.4%):Ir(ppy)$_3$ (6%):mCP/Tm(acac)$_3$phen (0.2%):FCNIrpic (18%):CzSi/ TmPyPB/LiF/Al. The evaporation plating rate for MoO$_3$ in the anode modification layer 3 was controlled at 0.01 nm/s, the evaporation plating rate of TAPC in the hole transporting-electron blocking layer 4 was controlled at 0.05 nm/s, the evaporation plating rates for PQ$_2$Ir(dpm), Ir(ppy)$_3$ and mCP in the hole-dominated light-emitting layer 5 were controlled at 0.0012 nm/s, 0.003 nm/s and 0.05 nm/s respectively, the evaporation plating rates for Tm(acac)$_3$phen, FCNIrpic, and CzSi in the electron-dominated light-emitting layer 6 were controlled at 0.0001 nm/s, 0.009 nm/s, and 0.05 nm/s respectively, the evaporation plating rate for TmPyPB in the hole blocking-electron transporting layer 7 was controlled at 0.05 nm/s, the evaporation plating rate for LiF in the cathode modification layer 8 was controlled at 0.01 nm/s, and the evaporation plating rate for Al in the metal cathode layer 9 was controlled at 1.0 nm/s.

The properties of the white organic electroluminescent device prepared in this example were tested. It was demonstrated by experimental results that the device emitted white light at about 462 nanometers, 515 nanometers, and 595 nanometers under the driving of a direct-current power supply. When the brightness was 20000 cd/m$^2$, the color coordinate of the device was (0.334, 0.336); and the color coordinate of the device was hardly changed as the operating voltage varied. The turn-on voltage of the device was 3.0 volts, and the maximal brightness of the device was 43588 cd/m$^2$. The maximal current efficiency of the device was 59.84 cd/A and the maximal power efficiency was 62.63 lm/W.

Example 3

An ITO anode layer on an ITO glass was laser-etched into a strip electrode, then ultrasonically cleaned sequentially with a cleaning liquid and deionized water for 15 min, and placed in an oven for drying. The dried substrate was then placed in a pretreating vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of 1-2×10$^{-5}$ Pa, a MoO$_3$ anode modification layer 3 having a thickness of 3 nm, a TAPC hole transporting-electron blocking layer 4 having a thickness of 40 nm, a TcTa hole-dominated light-emitting layer 5 doped with PQ$_2$Ir(dpm) and Ir(ppv)$_3$ having a thickness of 10 nm, a 26DCzPPy electron-dominated light-emitting layer 6 co-doped with Dy(acac)$_3$ and FCNIrpic having a thickness of 10 nm, and a TmPyPB hole blocking-electron transporting layer 7 having a thickness of 40 nm were sequentially evaporated on the ITO layer. Next, the uncompleted device was transferred to a metal evaporation plating chamber, and a LiF cathode modification layer 8 having a thickness of 1.0 nm was evaporated under a vacuum atmosphere of 4-6×10$^{-5}$ Pa. Finally, a metal Al cathode layer 9 having a thickness of 120 nm was evaporated on the LiF layer through a specially-made mask plate to prepare an organic electroluminescent device having the structure of ITO/MoO$_3$/TAPC/PQ$_2$Ir(dpm)(2.6%):Ir(ppy)$_3$ (7%):TcTa/Dy(acac)$_3$ (0.2%):FCNIrpic(16%):26DCzPPy/ TmPyPB/LiF/Al. The evaporation plating rate for MoO$_3$ in the anode modification layer 3 was controlled at 0.01 nm/s, the evaporation plating rate for TAPC in the hole transporting-electron blocking layer 4 was controlled at 0.05 nm/s, the evaporation plating rates for PQ$_2$Ir(dpm), Ir(ppy)$_3$ and TcTa in the hole-dominated light-emitting layer 5 were controlled at 0.0013 nm/s, 0.0035 nm/s and 0.05 nm/s respectively, the evaporation plating rates for Dy(acac)$_3$, FCNIrpic, and 26DCzPPy in the electron-dominated light-emitting layer 6 were controlled at 0.0001 nm/s, 0.008 nm/s, and 0.05 nm/s respectively, the evaporation plating rate for TmPvPB in the hole blocking-electron transporting layer 7 was controlled at 0.05 nm/s, the evaporation plating rate for LiF in the cathode modification layer 8 was controlled at 0.01 nm/s, and the evaporation plating rate for Al in the metal cathode layer 9 was controlled at 1.0 nm/s.

The properties of the white organic electroluminescent device prepared in this example were tested. It was demonstrated by experimental results that the device emitted white light at about 462 nanometers, 515 nanometers, and 595 nanometers under the driving of a direct-current power supply. When the brightness was 20000 cd/m$^2$, the color coordinate of the device was (0.333, 0.339); and the color coordinate of the device was hardly changed as the operating voltage varied. The turn-on voltage of the device was 3.0 volts, and the maximal brightness of the device was 44108 cd/m$^2$. The maximal current efficiency of the device was 60.79 cd/A and the maximal power efficiency was 63.63 lm/W.

Example 4

An ITO anode layer on an ITO glass was laser-etched into a strip electrode, then ultrasonically cleaned sequentially with a cleaning liquid and deionized water for 15 min, and placed in an oven for drying. The dried substrate was then placed in a pretreating vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of 1-2×10$^{-5}$ Pa, a MoO$_3$ anode modification layer 3 having a thickness of 5 nm, a TAPC hole transporting-electron blocking layer 4 having a thickness of 30 nm, a mCP hole-dominated light-emitting layer 5 doped with Ir(ppy)$_2$(acac) and Ir(btp)$_2$(acac) having a thickness of 15 nm, a 26DCzPPy electron-dominated light-emitting layer 6 co-doped with Tm(acac)$_3$phen and FIr6 having a thickness of 15 nm, and a 3TPYMB hole blocking-electron transporting layer 7 having a thickness of 35 nm were sequentially evaporated on the ITO layer. Next, the uncompleted device was transferred to a metal evaporation plating chamber, and a LiF cathode modification layer 8 having a thickness of 1.1 nm was evaporated under a vacuum atmosphere of 4-6×10$^{-5}$ Pa. Finally, a metal Al cathode layer 9 having a thickness of 250 nm was evaporated on the LiF layer through a specially-made mask plate to prepare an organic electroluminescent device having the structure of ITO/MoO$_3$/TAPC/Ir(ppy)$_2$(acac)(7%):Ir(btp)$_2$ (acac)(2%):mCP/Tm(acac)$_3$phen(0.2%):FIr6(12%):26DCz- PPy/3TPYMB/LiF/Al. The evaporation plating rate for MoO$_3$ in the anode modification layer 3 was controlled at 0.01 nm/s, the evaporation plating rate for TAPC in the hole transporting-electron blocking layer 4 was controlled at 0.05 nm/s, the evaporation plating rates for Ir(ppy)$_2$(acac), Ir(btp) $_2$(acac) and mCP in the hole-dominated light-emitting layer 5 were controlled at 0.0035 nm/s, 0.001 nm/s and 0.05 nm/s respectively, the evaporation plating rates for Tm(acac) $_3$phen, Fir6, and 26DCzPPy in the electron-dominated light-emitting layer 6 were controlled at 0.0001 nm/s, 0.006 nm/s, and 0.05 nm/s respectively, the evaporation plating rate for 3TPYMB in the hole blocking-electron transporting layer 7 was controlled at 0.05 nm/s, the evaporation plating rate for LiF in the cathode modification layer 8 was controlled at 0.01 nm/s, and the evaporation plating rate for Al in the metal cathode layer 9 was controlled at 1.0 nm/s.

The properties of the white organic electroluminescent device prepared in this example were tested. It was demonstrated by experimental results that the device emitted white light at about 462 nanometers, 515 nanometers, and 595 nanometers under the driving of a direct-current power supply. When the brightness was 20000 cd/m$^2$, the color coordinate of the device was (0.334, 0.335); and the color coordinate of the device was hardly changed as the operating voltage varied. The turn-on voltage of the device was 3.1 volts, and the maximal brightness of the device was 42175 cd/m$^2$. The maximal current efficiency of the device was 60.10 cd/A and the maximal power efficiency was 60.88 lm/W.

Example 5

An ITO anode layer on an ITO glass was laser-etched into a strip electrode, then ultrasonically cleaned sequentially with a cleaning liquid and deionized water for 15 min. and placed in an oven for drying. The dried substrate was then placed in a pretreating vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of 1-2×10$^{-5}$ Pa, a MoO$_3$ anode modification layer 3 having a thickness of 6 nm, a TAPC hole transporting-electron blocking layer 4 having a thickness of 50 nm, a TCP hole-dominated light-emitting layer 5 doped with Ir(mppy)$_3$ and Ir(piq)$_3$ having a thickness of 12 nm, a UGH2 electron-dominated light-emitting layer 6 co-doped with Tm(acac)$_3$phen and fac-Ir (Pmb)$_3$ having a thickness of 16 nm, and a BmPyPhB hole blocking layer 7 having a thickness of 45 nm were sequentially evaporated on the ITO layer. Next, the uncompleted device was transferred to a metal evaporation plating chamber, and a LiF cathode modification layer 8 having a thickness of 1.1 nm was evaporated under a vacuum atmosphere of 4-6×10$^{-5}$ Pa Finally, a metal Al cathode layer 9 having a thickness of 240 nm was evaporated on the LiF layer through a specially-made mask plate to prepare an organic electroluminescent device having the structure of ITO/MoO$_3$/TAPC/Ir(mppy)$_3$(8%):Ir(piq)$_3$(2.2%):TCP/Tm (acac)$_3$phen(0.3%):fac-Ir(Pmb)$_3$(18%):UGH2/BmPyPhB/LiF/Al. The evaporation plating rate for MoO$_3$ in the anode modification layer 3 was controlled at 0.01 nm/s, the evaporation plating rate for TAPC in the hole transporting-electron blocking layer 4 was controlled at 0.05 nm/s, the evaporation plating rates for Ir(mppy)$_3$, Ir(piq)$_3$ and TCP in the hole-dominated light-emitting layer 5 were controlled at 0.004 nm/s, 0.00011 nm/s and 0.05 nm/s respectively, the evaporation plating rates for Tm(acac)$_3$phen, fac-Ir(Pmb)$_3$, and UGH2 in the electron-dominated light-emitting layer 6 were controlled at 0.00015 nm/s, 0.009 nm/s, and 0.05 nm/s respectively, the evaporation plating rate for BmPyPhB in the hole blocking-electron transporting layer 7 was controlled at 0.05 nm/s, the evaporation plating rate for LiF in the cathode modification layer 8 was controlled at 0.01 nm/s, and the evaporation plating rate for Al in the metal cathode layer 9 was controlled at 1.2 nm/s.

The properties of the white organic electroluminescent device prepared in this example were tested. It was demonstrated by experimental results that the device emitted white light at about 462 nanometers, 515 nanometers, and 595 nanometers under the driving of a direct-current power supply. When the brightness was 20000 cd/m$^2$, the color coordinate of the device was (0.331, 0.332); and the color coordinate of the device was hardly changed as the operating voltage varied. The turn-on voltage of the device was 3.1 volts, and the maximal brightness of the device was 39876 cd/m$^2$. The maximal current efficiency of the device was 58.62 cd/A and the maximal power efficiency was 59.37 lm/W.

Example 6

An ITO anode layer on an ITO glass was laser-etched into a strip electrode, then ultrasonically cleaned sequentially with a cleaning liquid and deionized water for 15 min, and placed in an oven for drying. The dried substrate was then placed in a pretreating vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of 1-2×10$^{-5}$ Pa, a MoO$_3$ anode modification layer 3 having a thickness of 3 nm, a TAPC hole transporting-electron blocking layer 4 having a thickness of 40 nm, a BSB hole-dominated light-emitting layer 5 doped with Ir(ppy)$_2$(m-bppy) and Ir(piq)$_2$ (acac) having a thickness of 10 nm, a BCBP electron-dominated light-emitting layer 6 co-doped with Tm(acac)$_3$phen and mer-Ir(pmb)$_3$ having a thickness of 10 nm, and a TPBi hole blocking-electron transporting layer 7 having a thickness of 40 nm were sequentially evaporated on the ITO layer. Next, the uncompleted device was transferred to a metal evaporation plating chamber, and a LiF cathode modification layer 8 having a thickness of 1.0 nm was evaporated under a vacuum atmosphere of 4-6×10$^{-5}$ Pa. Finally, a metal Al cathode layer 9 having a thickness of 120 nm was evaporated on the LiF layer through a specially-made mask plate to prepare an organic electroluminescent device having the structure of ITO/MoO$_3$/TAPC/Ir(ppy)$_2$(m-bppy)(9%):Ir(piq)$_2$(acac)(3%):BSB/Tm(acac)$_3$phen(0.3%):mer-Ir(pmb)$_3$(25%):BCBP/TPBi/LiF/Al. The evaporation plating rate for MoO$_3$ in the anode modification layer 3 was controlled at 0.01 nm/s, the evaporation plating rate for TAPC in the hole transporting-electron blocking layer 4 was controlled at 0.05 nm/s, the evaporation plating rates for Ir(ppy)$_2$(m-bppy), Ir(piq)$_2$(acac) and BSB in the hole-dominated light-emitting layer 5 were controlled at 0.0045 nm/s, 0.00015 nm/s and 0.05 nm/s respectively, the evaporation plating rates for Tm(acac)$_3$phen, mer-Ir(pmb)$_3$, and BCBP in the electron-dominated light-emitting layer 6 were controlled at 0.0003 nm/s, 0.025 nm/s, and 0.1 nm/s respectively, the evaporation plating rate for TPBi in the hole blocking-electron transporting layer 7 was controlled at 0.08 nm/s, the evaporation plating rate for LiF in the cathode modification layer 8 was controlled at 0.005 nm/s, and the evaporation plating rate for Al in the metal cathode layer 9 was controlled at 0.5 nm/s.

The properties of the white organic electroluminescent device prepared in this example were tested. It was demonstrated by experimental results that the device emitted white light at about 462 nanometers, 515 nanometers, and 595 nanometers under the driving of a direct-current power supply. When the brightness was 20000 cd/m$^2$, the color coordinate of the device was (0.335, 0.341); and the color coordinate of the device was hardly changed as the operating voltage varied. The turn-on voltage of the device was 3.0 volts, and the maximal brightness of the device was 43122 cd/m$^2$. The maximal current efficiency of the device was 60.55 cd/A and the maximal power efficiency was 63.38 lm/W.

The descriptions of the above Examples are only used to help the understanding of the method of the present invention and the core idea thereof. It is to be indicated that, with respect to the person skilled in the art, various improvements and modifications may also be made to this invention without departing from the principle of this invention. These improvements and modifications also fall in the protection scope of the claims of this invention.

The above descriptions of the disclosed Examples enable the skilled person in the art to achieve or use this invention. Various amendments to these Examples will be apparent to those skilled in the art. General principles defined herein may be achieved in other examples without departing from the spirit or scope of this invention. Therefore, this invention will not be limited to these examples illustrated herein, but is to comply with the widest scope consistent with the principles and novel features disclosed herein.

What is claimed is:

1. A white organic electroluminescent device, comprising:
   a substrate;
   an anode layer provided on the substrate;
   an anode modification layer provided on the anode layer;
   a hole transporting-electron blocking layer provided on the anode modification layer;
   a hole-dominated light-emitting layer provided on the hole transporting-electron blocking layer;
   an electron-dominated light-emitting layer provided on the hole-dominated light-emitting layer;
   a hole blocking-electron transporting layer provided on the electron-dominated light-emitting layer;
   a cathode modification layer provided on the hole blocking-electron transporting layer; and
   a cathode layer provided on the cathode modification layer;
   wherein the electron-dominated light-emitting layer is composed of an organic sensitive material, a blue organic light-emitting material, and an electron-type organic host material wherein the content of the blue organic light-emitting material is 8.0 wt %-25.0 wt % of the content of the electron-type organic host material and wherein the electron-type organic host material is one or more selected from 2,6-bis[3-(9H-9-carbazoyl)phenyl]pyridine, 1,4-bis(triphenylsilyl)benzene, 2,2'-bis(4-(9-carbazoyl)phenyl)biphenyl, tris[2,4,6-trimethyl-3-(3-pyridinyl)phenyl]borane, 1,3,5-tri[(3-pyridinyl)-3-phenyl]benzene, 1,3-bis[3,5-di(3-pyridinyl)phenyl]benzene, 1,3,5-tris(1-phenyl-1H-benzimidazol-2-yl)benzene, 9-(4-tert-butylphenyl)-3,6-bis(triphenylsilyl)-9H-carbazole, and 9-(8-diphenylphosphoryl)-dibenzo[b, d]furan-9H-carbazole;
   the hole-dominated light-emitting layer is composed of a green organic light-emitting material, a red organic light-emitting material and a hole-type organic host material;
   the organic sensitive material is one or two selected from tris(acetylacetone)phenanthroline thulium and tris(acetylacetone)phenanthroline dysprosium wherein the organic sensitive material is 0.1 wt %-0.5 wt % of the electron-type organic host material; wherein the blue organic light-emitting material is one or more selected from bis((3,5-difluoro-4-cyanophenyl)pyridinato)picolinate iridium, bis(2,4-difluorophenylpyridinato)tetrakis(1-pyrazolyl)borate iridium, tris(1-phenyl-3-methylbenzimidazolin-2-ylidene-C,C2') iridium, tris(1-phenyl-3-methylbenzimidazolin-2-ylidene-C,C2') iridium, bis(2,4-difluorophenylpyridinato)(5-(pyridin-2-yl)-1H-tetrazolate)iridium, tris[(2,6-diisopropylphenyl)-2-phenyl-1H-imidazol[e]iridium, tris(1-phenyl-3-methylimidazolin-2-ylidene-C,C(2)')iridium, tris(1-phenyl-3-methylimidazolin-2-ylidene-C,C(2))iridium, bis(1-phenyl-3-methylimdazolin-2-ylidene-C,C$^{2'}$)(2-(2H-pyrazol-3-yl)-pyridine)iridium, bis(1-(4-methylphenyl)-3-methylimdazolin-2-ylidene-C,C$^{2'}$)(2-(2H-pyrazol-3-yl)-pyridine)iridium, bis(1-(4-fluorophenyl)-3-methylimdazoline-2-ylidene-C,C$^{2'}$)(2-(2H-pyrazol-3-yl)-pyridine)iridium, bis(1-(4-fluorophenyl)-3-methylimdazoline-2-ylidene-C,C$^{2'}$)(2-(5-trifluoromethyl-2H-pyrazol-3-yl)-pyridine)iridium, tris(1,3-diphenyl-benzimidazolin-2-ylidene-C,C$^{2'}$) iridium, bis(1-(4-fluorophenyl)-3-methylimdazoline-2-ylidene-C,C$^{2'}$)(3,5-dimethyl-2-(1H-pyrazol-5-yl)pyridine)iridium, bis(1-(4-methylphenyl)-3-methylimdazolin-2-ylidene-C,C$^{2'}$)(3,5-dimethyl-2-(1H-pyrazol-5-yl)pyridine)iridium, and tris(phenylpyrazole)iridium wherein the red organic light-emitting material is 1.0 wt %-3.0 wt % of the hole-type organic host material, the green organic light-emitting material is 5.0 wt %-10.0 wt % of the hole-type organic host material;
   the green organic light-emitting material is one or more selected from tris(2-phenylpyridine) iridium, bis(2-phenylpyridine)(acetylacetone) iridium, tris[2-(p-tolyl)pyridine] iridium, bis(2-phenylpyridine)[2-(diphen-3-yl)pyridine] iridium, tris(2-(3-paraxylene)pyridine iridium and tris(2-phenyl-3-methyl-pyridine) iridium and wherein,
   the red organic light-emitting material is one or more selected from bis(2-phenylquinoline)-(2,2,6,6-tetramethyl-3,5-heptanedionate) iridium, bis(2-benzo[b]-2-thiophenyl-pyridine)(acetylacetonate) iridium, tris(1-phenylisoquinoline) iridium, bis(1-phenylisoquinoline)(acetylacetone) iridium, bis[1-(9,9-dimethyl-9H-fluoren-2-yl)-isoquinoline](acetylacetone) iridium, bis[2-(9,9-dimethyl-9H-fluoren-2-yl)-quinoline](acetylacetone) iridium, bis(2-phenylquinoline)(2-(3-tolyl)pyridine) iridium, tris[2-phenyl-4-methylquinoline] iridium, bis(phenylisoquinoline)(2,2,6,6-tetramethylhexane-3,5-dione) iridium, bis(2-methyldibenzo[f,h]quinoxaline)(acetylacetone) iridium, and bis[2-(2-methylphenyl)-7-methyl-quinoline](acetylacetone) iridium, and
   the hole-type organic host material is one or more selected from 4,4'-N,N'-dicarbazole-biphenyl, 1,3-dicarbazol-9-ylbenzene, 9,9'-(5-(triphenylsilyl)-1,3-phenyl)bis-9H-carbazole, 1,3,5-tris(9-carbazoyl)benzene, 4,4',4''-tris(carbazol-9-yl)triphenylamine, and 1,4-bis(triphenylsilyl)biphenyl.

2. The white organic electroluminescent device according to claim 1, wherein the material of the hole transporting-electron blocking layer is one or more selected from 4,4'-cyclohexylidenebis[N,N-bis(4-methylphenyl)aniline], dipyrazino[2,3-f:2',3'-h]quinoxaline-2,3,6,7,10,11-hexacarbonitrile, N4,N4'-di(naphthalene-1-yl)-N4,N4'-bis(4-vinylphenyl)biphenyl-4,4'-diamine, N,N'-bis(3-methylphenyl)-N,N'-bis(phenyl)-2,7-diamino-9,9-spirobifluorene, N,N,N',N'-tetra-(3-methylphenyl)-3-3'-dimethylbenzidine, 2,2'-bis(3-

(N,N-di-p-tolylamino)phenyl)biphenyl, N,N'-bis(naphthalen-2-yl)-N,N'-bis(phenyl)benzidine, N,N'-bis(naphthalen-1-yl)-N,N'-diphenyl-2,7-diamino-9,9-spirobifluorene, N,N'-bis(3-methylphenyl)-N,N'-diphenyl-2,7-diamino-9,9-dimethylfluorene, N,N'-bis(naphthalen-1-yl)-N,N'-diphenyl-2,7-diamino-9,9-dimethylfluorene, N,N'-bis(3-methylphenyl)-N,N'-diphenyl-2,7-diamino-9,9-diphenylfluorene, N,N'-bis(naphthalen-1-yl)-N,N'-diphenyl-2,7-diamino-9,9-diphenylfluorene, N,N'-bis(naphthalen-1-yl)-N,N'-diphenyl-2,2'-dimethylbenzidine, 2,2',7,7'-tetrakis(N,N-diphenylamino)-2,7-diamino-9,9-spirobifluorene, 9,9-bis[4-(N,N-bis-naphthalen-2-yl-amino)phenyl]-9H-fluorene, 9,9-[4-(N-naphthalen-1-yl-N-anilino)-phenyl]-9H-fluorene, 2,2'-bis[N,N-bis(4-phenyl)amino]-9,9-spirobifluorene, 2,2'-bis(N,N-phenylamino)-9,9-spirobifluorene, N,N'-diphenyl-N,N'-(1-naphthyl)-1,1'-biphenyl-4,4'-diamine, and 4,4'-bis[N-(p-tolyl)-N-phenyl-amino]diphenyl.

3. The white organic electroluminescent device according to claim 1, wherein the material of the hole blocking-electron transporting layer is one or more selected from tris[2,4,6-trimethyl-3-(3-pyridinyl)phenyl]borane, 1,3,5-tri[(3-pyridinyl)-3-phenyl]benzene, 1,3-bis[3,5-di(3-pyridinyl)phenyl]benzene, and 1,3,5-tris(1-phenyl-1H-benzimidazol-2-yl)benzene.

4. The white organic electroluminescent device according to claim 1, wherein the anode modification layer has a thickness of 1-10 nm, the hole transporting-electron blocking layer has a thickness of 30-60 nm, the hole-dominated light-emitting layer has a thickness of 5-20 nm, the electron-dominated light-emitting layer has a thickness of 5-20 nm, the hole blocking-electron transporting layer has a thickness of 30-60 nm, the cathode modification layer has a thickness of 0.8-1.2 nm, and the cathode layer has a thickness of 90-300 nm.

5. A preparation method of a white organic electroluminescent device, comprising the steps of:
  etching an anode layer on a substrate, and after drying, evaporation plating an anode modification layer, a hole transporting-electron blocking layer, a hole-dominated light-emitting layer, an electron-dominated light-emitting layer, a hole blocking-electron transporting layer, a cathode modification layer, and a cathode layer in turn on the anode layer,
wherein a material of the electron-dominated light-emitting layer is composed of an organic sensitive material, a blue organic light-emitting material, and an electron-type organic host material;
the hole-dominated light-emitting layer is composed of a green organic light-emitting material, a red organic light-emitting material and a hole-type organic host material;
the organic sensitive material is one or two selected from tris(acetylacetone)phenanthroline thulium and tris(acetylacetone)phenanthroline dysprosium; and
the organic sensitive material is 0.1 wt %-0.5 wt % of the electron-type organic host material; wherein the evaporation plating rate for the anode modification layer is 0.01-0.05 nm/s; the evaporation plating rates for the hole transporting-electron blocking layer, the host material in the hole-dominated light-emitting layer, the host material in the electron-dominated light-emitting layer, and the hole blocking-electron transporting layer are 0.05-0.1 nm/s; the evaporation plating rate for the organic sensitized material in the electron-dominated light-emitting layer is 0.00005-0.0005 nm/s; the evaporation plating rate for the blue organic light-emitting material in the electron-dominated light-emitting layer is 0.004-0.025 nm/s; the evaporation plating rate for the red light-emitting material in the hole-dominated light-emitting layer is 0.0005-0.003 nm/s; the evaporation plating rate for the green organic light-emitting material in the hole-dominated light-emitting layer is 0.0025-0.01 nm/s; the evaporation plating rate for the cathode modification layer is 0.005-0.05 nm/s; and the evaporation plating rate for the cathode layer is 0.5-2.0 nm/s.

* * * * *